(12) United States Patent
Fujii et al.

(10) Patent No.: US 9,355,988 B2
(45) Date of Patent: May 31, 2016

(54) SEMICONDUCTOR DEVICE

(71) Applicant: ROHM CO., LTD., Kyoto-shi, Kyoto (JP)

(72) Inventors: Kenji Fujii, Kyoto (JP); Yasumasa Kasuya, Kyoto (JP); Mamoru Yamagami, Kyoto (JP); Naoki Kinoshita, Kyoto (JP); Motoharu Haga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/669,169

(22) Filed: Mar. 26, 2015

(65) Prior Publication Data
US 2015/0294928 A1   Oct. 15, 2015

(30) Foreign Application Priority Data

Apr. 9, 2014 (JP) ................. 2014-079923
Apr. 9, 2014 (JP) ................. 2014-079924
Apr. 9, 2014 (JP) ................. 2014-079925
Mar. 19, 2015 (JP) ................. 2015-056472

(51) Int. Cl.
*H01L 23/495* (2006.01)
*H01L 23/52* (2006.01)
(Continued)

(52) U.S. Cl.
CPC .............. *H01L 24/33* (2013.01); *H01L 23/291* (2013.01); *H01L 23/3107* (2013.01); *H01L 23/3142* (2013.01); *H01L 23/3171* (2013.01); *H01L 23/4334* (2013.01); *H01L 23/4822* (2013.01); *H01L 23/49548* (2013.01); *H01L 23/49551* (2013.01); *H01L 23/49572* (2013.01); *H01L 24/02* (2013.01); *H01L 24/05* (2013.01); *H01L 24/13* (2013.01); *H01L 24/17* (2013.01); *H01L 24/75* (2013.01); *H01L 24/81* (2013.01); *H01L 24/83* (2013.01); *H01L 23/525* (2013.01); *H01L 24/03* (2013.01); *H01L 24/11* (2013.01); *H01L 24/16* (2013.01); *H01L 24/73* (2013.01);
(Continued)

(58) Field of Classification Search
CPC ............ H01L 23/498; H01L 23/49541; H01L 23/4952; H01L 23/3171; H01L 23/3107; H01L 23/4951; H01L 23/49568; H01L 23/4982; H01L 23/49513
USPC .......... 257/666–676, 773, 778, 787, E23.039, 257/E23.004, E23.043, E23.054, E23.124, 257/E21.499, E21.51, E21.511
See application file for complete search history.

(56) References Cited

U.S. PATENT DOCUMENTS 6,060,769 A * 5/2000 Wark ........................... 257/666
2014/0001620 A1   1/2014 Shimizu et al.

FOREIGN PATENT DOCUMENTS

JP     2014-7363     1/2014

*Primary Examiner* — Jasmine Clark
(74) *Attorney, Agent, or Firm* — Hamre, Schumann, Mueller & Larson, P.C.

(57) ABSTRACT

A semiconductor device has a semiconductor element provided with a functional surface on which a functional circuit is formed and with a back surface facing in the opposite direction to the functional surface, while also having a lead supporting the semiconductor element and electrically connected to the semiconductor element, and a resin package covering at least a portion of the semiconductor element and the lead. The semiconductor element has a functional surface side electrode formed on the functional surface and equipped with a functional surface side raised part that projects in the direction in which the functional surface faces. The functional surface side raised part of the functional surface side electrode is joined to the lead by solid state bonding.

30 Claims, 21 Drawing Sheets

(51) Int. Cl.
   *H01L 23/00*      (2006.01)
   *H01L 23/31*      (2006.01)
   *H01L 23/29*      (2006.01)
   *H01L 23/433*     (2006.01)
   *H01L 23/482*     (2006.01)
   *H01L 23/525*     (2006.01)

(52) U.S. Cl.
   CPC ... *H01L2224/024* (2013.01); *H01L 2224/0239* (2013.01); *H01L 2224/02311* (2013.01); *H01L 2224/02331* (2013.01); *H01L 2224/0345* (2013.01); *H01L 2224/0346* (2013.01); *H01L 2224/03452* (2013.01); *H01L 2224/03462* (2013.01); *H01L 2224/05008* (2013.01); *H01L 2224/05073* (2013.01); *H01L 2224/05082* (2013.01); *H01L 2224/05083* (2013.01); *H01L 2224/05084* (2013.01); *H01L 2224/05124* (2013.01); *H01L 2224/05147* (2013.01); *H01L 2224/05155* (2013.01); *H01L 2224/05181* (2013.01); *H01L 2224/05548* (2013.01); *H01L 2224/05567* (2013.01); *H01L 2224/05572* (2013.01); *H01L 2224/05582* (2013.01); *H01L 2224/05624* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/1145* (2013.01); *H01L 2224/1146* (2013.01); *H01L 2224/1147* (2013.01); *H01L 2224/1161* (2013.01); *H01L 2224/11825* (2013.01); *H01L 2224/13008* (2013.01); *H01L 2224/13011* (2013.01); *H01L 2224/13016* (2013.01); *H01L 2224/13017* (2013.01); *H01L 2224/13019* (2013.01); *H01L 2224/13024* (2013.01); *H01L 2224/13147* (2013.01); *H01L 2224/13582* (2013.01); *H01L 2224/13624* (2013.01); *H01L 2224/13644* (2013.01); *H01L 2224/13647* (2013.01); *H01L 2224/13655* (2013.01); *H01L 2224/13664* (2013.01); *H01L 2224/13666* (2013.01); *H01L 2224/16014* (2013.01); *H01L 2224/16245* (2013.01); *H01L 2224/16258* (2013.01); *H01L 2224/17107* (2013.01); *H01L 2224/29082* (2013.01); *H01L 2224/29124* (2013.01); *H01L 2224/29144* (2013.01); *H01L 2224/29147* (2013.01); *H01L 2224/29155* (2013.01); *H01L 2224/29164* (2013.01); *H01L 2224/29166* (2013.01); *H01L 2224/32245* (2013.01); *H01L 2224/73253* (2013.01); *H01L 2224/753* (2013.01); *H01L 2224/75301* (2013.01); *H01L 2224/75981* (2013.01); *H01L 2224/8146* (2013.01); *H01L 2224/8183* (2013.01); *H01L 2224/81191* (2013.01); *H01L 2224/81192* (2013.01); *H01L 2224/81201* (2013.01); *H01L 2224/81439* (2013.01); *H01L 2224/81444* (2013.01); *H01L 2224/81447* (2013.01); *H01L 2224/81455* (2013.01); *H01L 2224/81464* (2013.01); *H01L 2224/81466* (2013.01); *H01L 2224/8346* (2013.01); *H01L 2224/8383* (2013.01); *H01L 2224/83191* (2013.01); *H01L 2224/83201* (2013.01); *H01L 2224/83439* (2013.01); *H01L 2224/83444* (2013.01); *H01L 2224/83447* (2013.01); *H01L 2224/83455* (2013.01); *H01L 2224/83464* (2013.01); *H01L 2224/83466* (2013.01); *H01L 2224/92225* (2013.01); *H01L 2924/01013* (2013.01); *H01L 2924/01022* (2013.01); *H01L 2924/01029* (2013.01); *H01L 2924/01073* (2013.01); *H01L 2924/01074* (2013.01); *H01L 2924/05042* (2013.01); *H01L 2924/07025* (2013.01); *H01L 2924/17724* (2013.01); *H01L 2924/17747* (2013.01); *H01L 2924/181* (2013.01); *H01L 2924/182* (2013.01); *H01L 2924/186* (2013.01)

SEMICONDUCTOR DEVICE

BACKGROUND OF THE INVENTION

1. Field of the Invention

The present invention relates to a semiconductor device.

2. Description of Related Art

In a semiconductor device having a built-in semiconductor element, a conduction supporting member that constitutes a conduction path to the semiconductor device and supports the semiconductor element is used. In such a semiconductor device, a lead made of a metal is used as the conduction supporting member. A plurality of wires made of Au or the like are used as means for electrically connecting the semiconductor element to the lead. Known documents relating to semiconductor devices include JP-A-2014-7363, for example.

In the manufacturing process of the semiconductor device, a process for bonding the plurality of wires is executed. This bonding process is performed sequentially on the plurality of wires, and cannot be executed collectively on the plurality of wires. This is thus an impediment to improving the manufacturing efficiency of the semiconductor device. Also, the wires are comparatively thin, and thus could possibly be unintentionally cut or separate during the manufacturing process of the semiconductor device or use of the semiconductor device. Also, in the case of joining the semiconductor device to a heat dissipation member called an island or the like, the semiconductor device and the heat dissipation member are joined via a joining material. Improved efficiency and increased reliability of this junction are desired.

SUMMARY OF THE INVENTION

The present invention has been proposed under the above circumstances, and an object of the present invention is to provide a semiconductor device that can enhance manufacturing efficiency and enables the semiconductor element to be more reliably joined to the conduction connection member. Also, another object of the present invention is to provide a semiconductor device that can enhance manufacturing efficiency and enables the semiconductor element to be more reliably joined to the heat dissipation member.

A semiconductor device according to a first aspect of the present invention is provided with a semiconductor element having a functional surface on which a functional circuit is formed and a back surface facing in an opposite direction to the functional surface, a conduction supporting member supporting the semiconductor element and electrically connected to the semiconductor element, and a resin package at least partially covering the semiconductor element and the conduction supporting member, the semiconductor element having a functional surface side electrode formed on the functional surface and equipped with a functional surface side raised part that projects in a direction in which the functional surface faces, and the functional surface side raised part of the functional surface side electrode being joined to the conduction supporting member by solid state bonding.

Preferably, the functional surface side electrode has a base layer that contacts the functional surface.

Preferably, the base layer is made of Al.

Preferably, the functional surface side raised part and the base layer do not overlap with each other in plan view.

Preferably, the functional surface side electrode has a foundation layer laminated on the base layer.

Preferably, the foundation layer is made of one of Ti, W and Ta.

Preferably, the functional surface side electrode has a redistribution layer laminated on the foundation layer, and the functional surface side raised part is formed on the redistribution layer.

Preferably, the redistribution layer is made of Cu.

Preferably, the redistribution layer is larger than the base layer in plan view.

Preferably, the functional surface side electrode has a joining promotion layer that is positioned as an uppermost layer.

Preferably, the joining promotion layer of the functional surface side electrode contains at least one of Ni and Pd.

Preferably, the joining promotion layer of the functional surface side electrode has a Ni layer laminated on the functional surface side raised part and a Pd layer laminated on the Ni layer.

Preferably, the semiconductor device is provided with a passivation film covering the functional surface and having formed therein a through hole that allows the functional surface side electrode to reach the functional surface.

Preferably, the passivation film is made of SiN.

Preferably, the redistribution layer overlaps with the passivation film in plan view.

Preferably, the functional surface side raised part overlaps with the passivation film in plan view.

Preferably, the semiconductor device is provided with a protective film laminated on the passivation film.

Preferably, the protective film is made of polyimide.

Preferably, the redistribution layer overlaps with the protective film in plan view.

Preferably, the functional surface side raised part overlaps with the protective film in plan view.

Preferably, the functional surface side raised part is made of Cu.

Preferably, the conduction supporting member is a lead made of a metal.

Preferably, a portion of the lead projects from the resin package.

Preferably, a surface of the lead on an opposite side to a region where the lead is joined to the functional surface side electrode has unevenness.

Preferably, the semiconductor device has a plurality of the functional surface side electrode.

Preferably, the functional surface side electrode has a plurality of the functional surface side raised part.

Preferably, the semiconductor device is further provided with a heat dissipation member joined to the semiconductor element, the semiconductor element has a back surface metal layer formed on the back surface, and the back surface metal layer of the semiconductor element is joined to the heat dissipation member by solid state bonding.

Preferably, a joining promotion layer is laminated on the back surface metal layer.

Preferably, the joining promotion layer on the back surface metal layer contains at least one of Ni and Pd.

Preferably, a joining promotion layer is laminated on the heat dissipation member.

Preferably, the joining promotion layer on the heat dissipation member contains at least one of Ni and Pd.

Preferably, a surface of the heat dissipation member on an opposite side to a region where the heat dissipation member is joined to the back surface metal layer has unevenness.

Preferably, a surface of the heat dissipation member on an opposite side to a region where the heat dissipation member is joined to the back surface metal layer is exposed from the resin package.

A semiconductor device according to a second aspect of the present invention is provided with a semiconductor element having a functional surface on which a functional circuit is formed and a back surface facing in an opposite direction to the functional surface, a conduction supporting member supporting the semiconductor element and electrically connected to the semiconductor element, and a resin package at least partially covering the semiconductor element and the conduction supporting member, the semiconductor element having a functional surface side electrode formed on the functional surface, the conduction supporting member having a conduction supporting member side raised part that projects toward the functional surface side electrode, and the functional surface side electrode being joined to the conduction supporting member side raised part of the conduction supporting member by solid state bonding.

Preferably, the functional surface side electrode has a base layer that contacts the functional surface.

Preferably, the base layer is made of Al.

Preferably, the conduction supporting member side raised part and the base layer do not overlap with each other in plan view.

Preferably, the functional surface side electrode has a foundation layer laminated on the base layer.

Preferably, the foundation layer is made of one of Ti, W and Ta.

Preferably, the functional surface side electrode has a redistribution layer laminated on the foundation layer.

Preferably, the redistribution layer is made of Cu.

Preferably, the redistribution layer is larger than the base layer in plan view.

Preferably, the functional surface side electrode has a joining promotion layer that is positioned as an uppermost layer.

Preferably, the joining promotion layer of the functional surface side electrode contains at least one of Ni and Pd.

Preferably, the joining promotion layer of the functional surface side electrode has a Ni layer that is positioned on the functional surface side and a Pd layer laminated on the Ni layer.

Preferably, the semiconductor device is provided with a passivation film covering the functional surface and having formed therein a through hole that allows the functional surface side electrode to reach the functional surface.

Preferably, the passivation film is made of SiN.

Preferably, the redistribution layer overlaps with the passivation film in plan view.

Preferably, the conduction supporting member side raised part overlaps with the passivation film in plan view.

Preferably, the semiconductor device is provided with a protective film laminated on the passivation film.

Preferably, the protective film is made of polyimide.

Preferably, the redistribution layer overlaps with the protective film in plan view.

Preferably, the conduction supporting member side raised part overlaps with the protective film in plan view.

Preferably, the conduction supporting member is a lead made of a metal.

Preferably, a portion of the lead projects from the resin package.

Preferably, a surface of the lead on an opposite side to a region where the lead is joined to the functional surface side electrode has unevenness.

Preferably, the conduction supporting member side raised part is constituted by a portion that is thicker than a surrounding portion.

Preferably, the conduction supporting member side raised part has a through hole formed therein.

Preferably, the conduction supporting member side raised part is formed from a bent portion of the conduction supporting member.

Preferably, the semiconductor device has a plurality of the functional surface side electrode.

Preferably, the functional surface side electrode is joined to the plurality of conduction supporting member side raised parts.

Preferably, the semiconductor device is further provided with a heat dissipation member joined to the semiconductor element, the semiconductor element has a back surface metal layer formed on the back surface, and the back surface metal layer of the semiconductor element is joined to the heat dissipation member by solid state bonding.

Preferably, a joining promotion layer is laminated on the back surface metal layer.

Preferably, the joining promotion layer on the back surface metal layer contains at least one of Ni and Pd.

Preferably, a joining promotion layer is laminated on the heat dissipation member.

Preferably, the joining promotion layer on the heat dissipation member contains at least one of Ni and Pd.

Preferably, a surface of the heat dissipation member on an opposite side to a region where the heat dissipation member is joined to the back surface metal layer has unevenness.

Preferably, a surface of the heat dissipation member on an opposite side to a region where the heat dissipation member is joined to the back surface metal layer is exposed from the resin package.

A semiconductor device according to a third aspect of the present invention is provided with a semiconductor element having a functional surface on which a functional circuit is formed and a back surface facing in an opposite direction to the functional surface, a conduction supporting member supporting the semiconductor element and electrically connected to the semiconductor element, a heat dissipation member joined to the semiconductor element, and a resin package at least partially covering the semiconductor element, the conduction supporting member and the heat dissipation member, the semiconductor element having a back surface metal layer formed on the back surface, and the back surface metal layer of the semiconductor element being joined to the heat dissipation member by solid state bonding.

Preferably, a joining promotion layer is laminated on the back surface metal layer.

Preferably, the joining promotion layer on the back surface metal layer contains at least one of Ni and Pd.

Preferably, a joining promotion layer is laminated on the heat dissipation member.

Preferably, the joining promotion layer on the heat dissipation member contains at least one of Ni and Pd.

Preferably, a surface of the heat dissipation member on an opposite side to a region where the heat dissipation member is joined to the back surface metal layer has unevenness.

Preferably, the semiconductor element has a functional surface side electrode formed on the functional surface.

Preferably, the functional surface side electrode is equipped with a functional surface side raised part that projects in a direction in which the functional surface faces, and the functional surface side raised part of the functional surface side electrode is joined to the conduction supporting member by solid state bonding.

Preferably, the conduction supporting member has a conduction supporting member side raised part that projects toward the functional surface side electrode, and the functional surface side electrode is joined to the conduction supporting member side raised part of the conduction supporting member by solid state bonding.

Preferably, the functional surface side electrode has a base layer that contacts the functional surface.

Preferably, the base layer is made of Al.

Preferably, the functional surface side electrode has a foundation layer laminated on the base layer.

Preferably, the foundation layer is made of one of Ti, W and Ta.

Preferably, the functional surface side electrode has a redistribution layer laminated on the foundation layer.

Preferably, the redistribution layer is made of Cu.

Preferably, the redistribution layer is larger than the base layer in plan view.

Preferably, the functional surface side electrode has a joining promotion layer that is positioned as an uppermost layer.

Preferably, the joining promotion layer of the functional surface side electrode contains at least one of Ni and Pd.

Preferably, the semiconductor device is provided with a passivation film covering the functional surface and having formed therein a through hole that allows the functional surface side electrode to reach the functional surface.

Preferably, the passivation film is made of SiN.

Preferably, the redistribution layer overlaps with the passivation film in plan view.

Preferably, the semiconductor device is provided with a protective film laminated on the passivation film.

Preferably, the protective film is made of polyimide.

Preferably, the redistribution layer overlaps with the protective film in plan view.

Preferably, the conduction supporting member is a lead made of a metal.

Preferably, a portion of the lead projects from the resin package.

Preferably, a surface of the lead on an opposite side to a region where the lead is joined to the functional surface side electrode has unevenness.

Other features and advantages of the present invention will become apparent from the following detailed description with reference to the attached drawings.

BRIEF DESCRIPTION IN THE DIAGRAMS

DESCRIPTION OF THE PREFERRED EMBODIMENTS

Hereinafter, preferred embodiments of the present invention will be described with reference to the drawings.

FIGS. 1 to 6 show a semiconductor device that is based on a first embodiment of the present invention. A semiconductor device A1 of the present embodiment is provided with leads 101 to 107, a semiconductor element 300, and a sealing resin 400.

Figure 1:
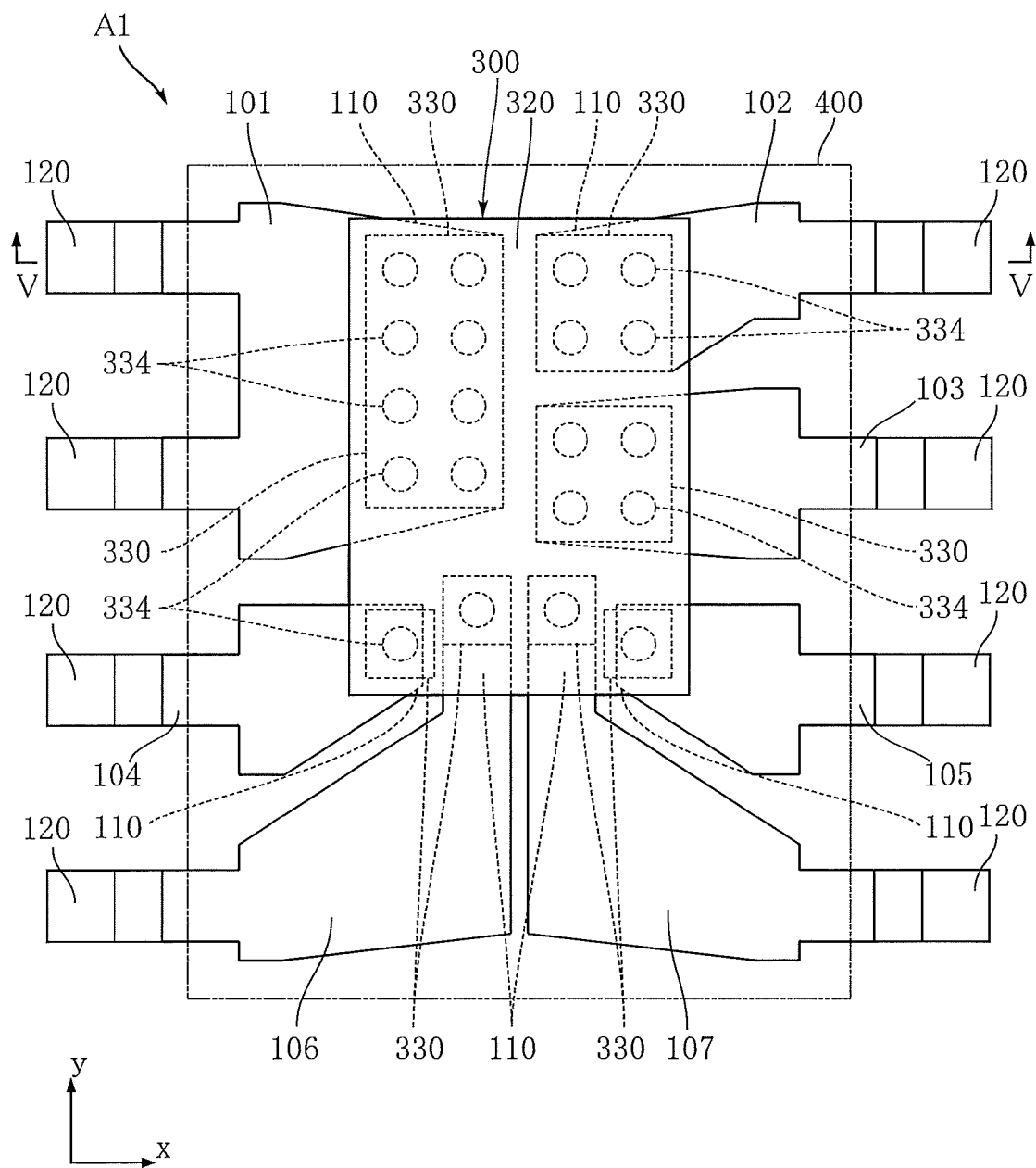
FIG. 1 is a plan view showing a semiconductor device that is based on a first embodiment of the present invention.
Figure 2:
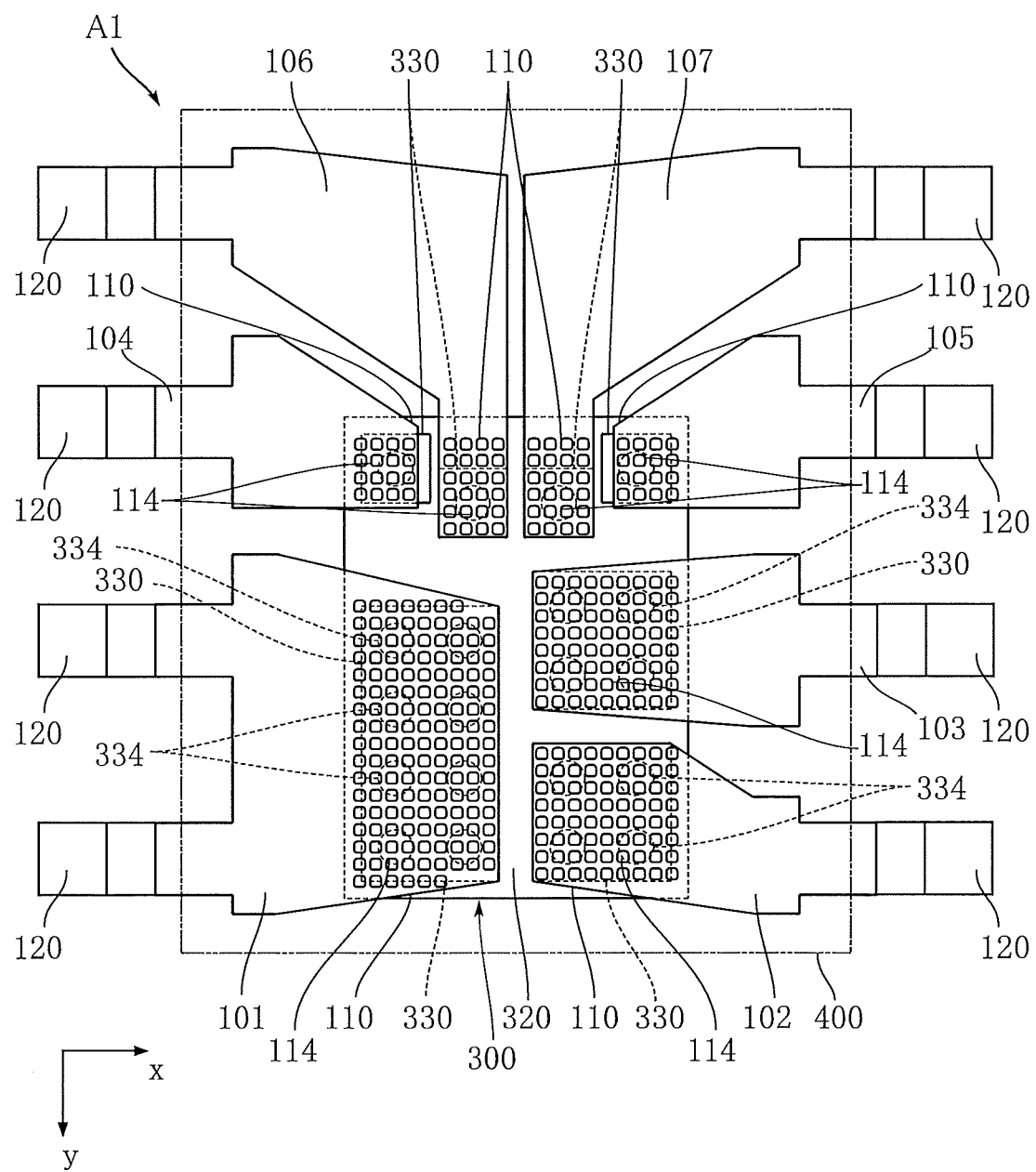
FIG. 2 is a bottom view showing the semiconductor device of FIG. 1.
Figure 3:
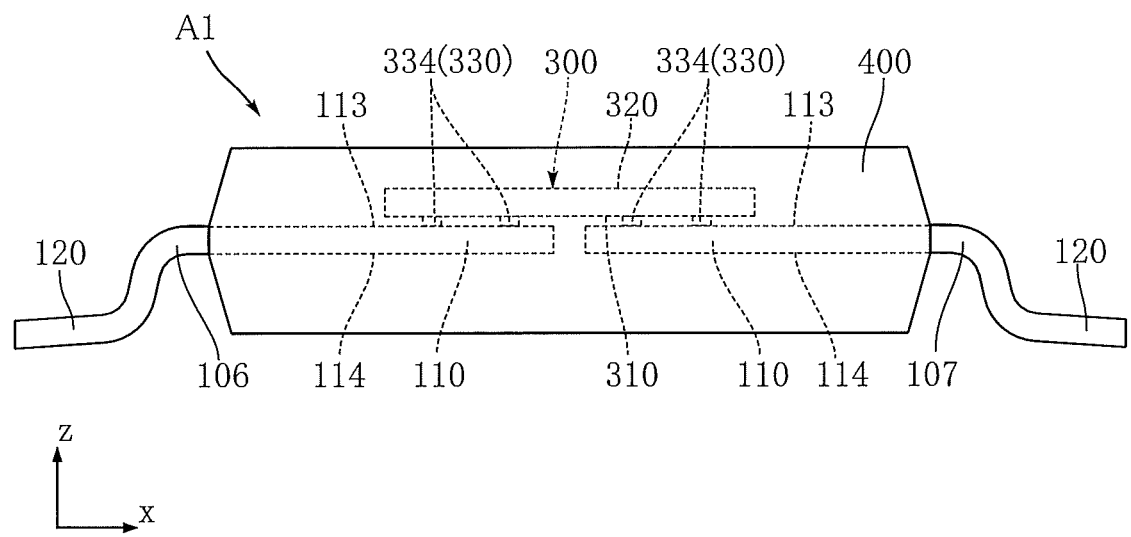
FIG. 3 is a front view showing the semiconductor device of FIG. 1.
Figure 4:
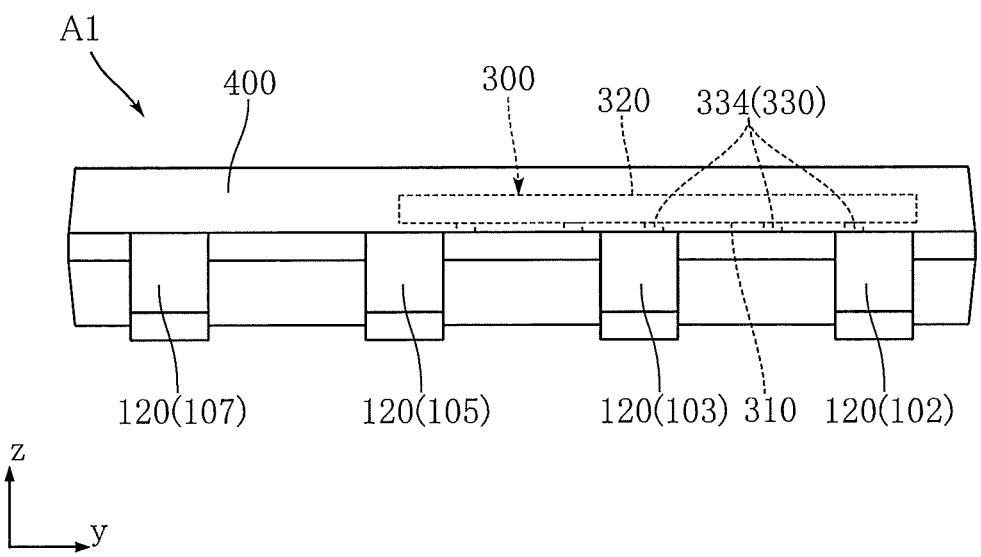
FIG. 4 is a side view showing the semiconductor device of FIG. 1.
Figure 5:
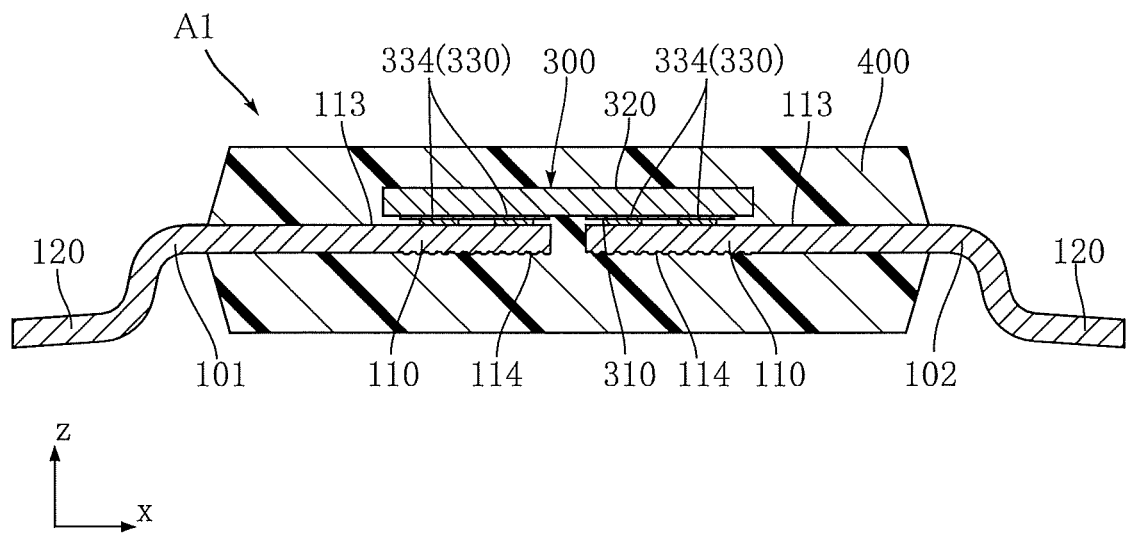
FIG. 5 is a cross-sectional view along a line V-V in FIG. 1.
Figure 6:
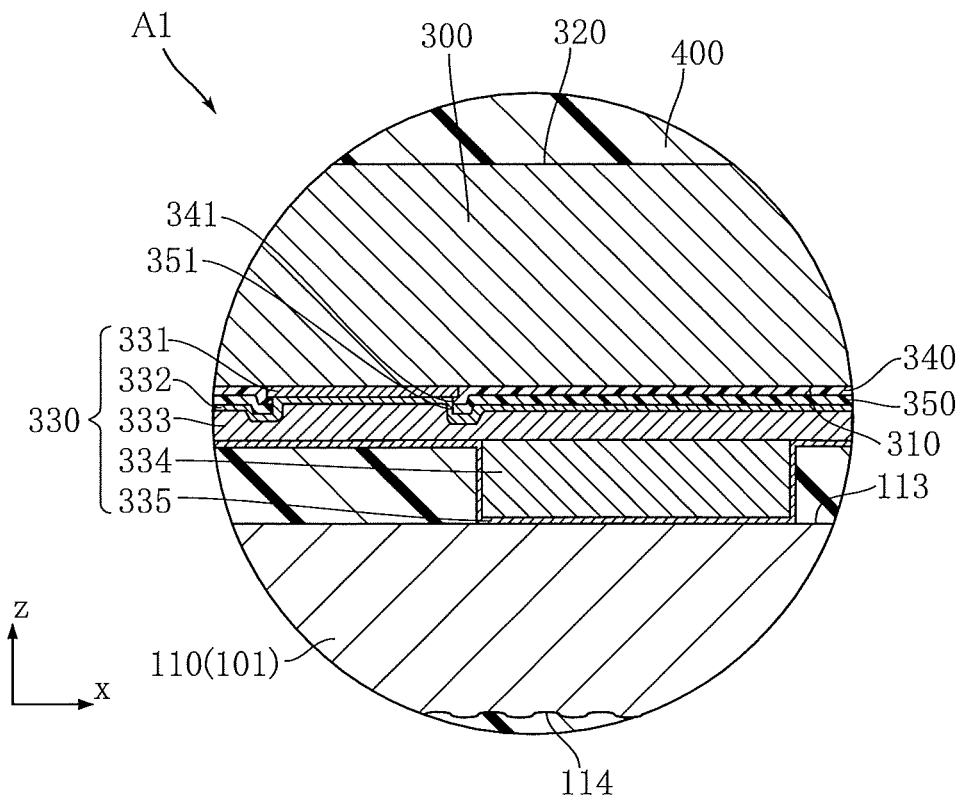
FIG. 6 is an enlarged cross-sectional view showing a main section of the semiconductor device of FIG. 1.

FIG. 1 is a plan view showing the semiconductor device A1. FIG. 2 is a bottom view showing the semiconductor device A1. FIG. 3 is a front view showing the semiconductor device A1. FIG. 4 is a side view showing the semiconductor device A1. FIG. 5 is a cross-sectional view along a line V-V in FIG. 1. FIG. 6 is an enlarged cross-sectional view showing a main section of the semiconductor device A1.

The leads 101 to 107 are examples of a conduction supporting member as referred to in the present invention. The leads 101 to 107 constitute conduction paths between the semiconductor element 300 and outside the semiconductor device A1, and support the semiconductor element 300. The leads 101 to 107 are made of a metal, and are preferably made of either Cu or Ni, an alloy thereof, alloy 42, or the like. Also, a plating layer of Ti, Ag, Pd, Au or the like may be provided on the surface of the leads 101 to 107. The present embodiment will be described taking the case where the leads 101 to 107 are made of Cu as an example. The leads 101 to 107 are not particularly limited in thickness, and have, for example, a thickness of 50 μm to 500 μm, and preferably 100 μm to 150 μm.

The leads 101 to 107 each have an opposing part 110 and a terminal part 120. The opposing part 110 overlaps with the semiconductor element 300 in plan view, and opposes a functional surface side electrode 330 of the semiconductor element 300 which will be discussed later. The terminal part 120 is exposed from the sealing resin 400 and is used for mounting the semiconductor device A1 to a circuit board or the like. As shown in FIGS. 3 and 5, the leads 101 to 107 have a bent part between the opposing part 110 and the terminal part 120. Also, the lead 101 has two terminal parts 120.

As shown in FIG. 5, the opposing parts 110 have a joining surface 113 and a back surface 114. The joining surfaces 113 face the functional surface side electrodes 330 of the semiconductor element 300, and are joined to the functional surface side electrodes 330. The back surfaces 114 face in the opposite direction to the joining surfaces 113.

As shown in FIGS. 2 and 6, the back surface 114 of the opposing part 110 has unevenness. This uneven portion has a depth of about 20 μm, for example.

In the present embodiment, as shown in FIG. 1, the terminal parts 120 of the leads 101, 104 and 106 project to the left in the diagram. Also, the terminal parts 120 of the leads 102, 103, 105 and 107 project to the right in the diagram. The opposing part 110 of the lead 101 is comparatively large. The opposing parts 110 of the leads 102 and 103 are smaller than the opposing part 110 of the lead 101, and are aligned in the y direction. The opposing part 110 of the lead 101 is aligned in the x direction with the opposing parts 110 of the leads 102 and 103. The opposing parts 110 of the leads 104, 105, 106 and 107 are comparatively small. The opposing parts 110 of the leads 106 and 107 are disposed so as to be aligned in the x direction toward the center in the x direction. The opposing parts 110 of the leads 104 and 105 are disposed on either side in the x direction with the opposing parts 110 of the leads 106 and 107 sandwiched therebetween.

The semiconductor element 300 is an element that exhibits the functions of the semiconductor device A1 and is not particularly limited in type, with it being possible to select from various types of elements such as a transistor, a diode or an LSI. As shown in FIG. 5, the semiconductor element 300 has a functional surface 310 and a back surface 320. The back surface 320 has formed thereon a functional circuit (not shown) that realizes the functions of the semiconductor element 300. The back surface 320 faces in the opposite direction to the functional surface 310. The semiconductor element 300 is manufactured from a wafer made of Si or the like, for example.

The semiconductor element 300 has a plurality of functional surface side electrodes 330, a passivation film 340, and a protective film 350.

The plurality of functional surface side electrodes 330 are formed on the functional surface 310 and are each electrically connected to a different one of the leads 101 to 107. In the present embodiment, seven functional surface side electrodes 330 are formed in correspondence with the leads 101 to 107. These functional surface side electrodes 330 have a common basic configuration despite differing in size and disposition.

In the present embodiment, as shown in FIG. 1, the functional surface side electrode 330 that opposes the opposing part 110 of the lead 101 is comparatively large, and has an oblong shape in plan view with the longitudinal direction being in the y direction. The two functional surface side electrodes 330 that oppose the opposing parts 110 of the leads 102 and 103 have a substantially square shape in plan view and are aligned in the y direction. The functional surface side electrode 330 that opposes the opposing part 110 of the lead 101 is aligned in the x direction with the two functional surface side electrodes 330 that oppose the opposing parts 110 of the leads 102 and 103. The four functional surface side electrodes 330 that oppose the opposing parts 110 of the leads 104, 105, 106 and 107 are comparatively small and have a substantially square shape in plan view. The two functional surface side electrodes 330 that oppose the opposing parts 110 of the leads 106 and 107 are disposed so as to be aligned in the x direction toward the center in the x direction. The two functional surface side electrodes 330 that oppose the opposing parts 110 of the leads 104 and 105 are disposed on either side in the x direction with the opposing parts 110 of the leads 106 and 107 sandwiched therebetween.

As shown in FIGS. 1, 5 and 6, the functional surface side electrodes 330 have a base layer 331, a foundation layer 332, a redistribution layer 333, a functional surface side raised part 334, and a joining promotion layer 335.

The base layer 331 contacts the functional surface 310, and is electrically connected directly to an appropriate place of the functional circuit on the functional surface 310. The functional surface 310 is made of Al, for example. The base layer 331 has a thickness of 0.1 μm to 10 μm, for example.

Here, the passivation film 340 and the protective film 350 will be described. The passivation film 340 is for preventing an excessive force from being loaded on the Si which is a main constituent of the semiconductor element 300, and is made of an insulating material such as SiN, for example. The passivation film 340 has a thickness of 200 nm to 3 μm, for example. The protective film 350 is laminated on the passivation film 340, and is for preventing an excessive force from being loaded on the Si which is a main constituent of the semiconductor element 300 and for facilitating formation of the redistribution layer 333. The protective film 350 is made of an insulating material such as polyimide, for example. The protective film 350 has a thickness of about 5 Tim, for example.

A through hole 341 is formed in the passivation film 340. The through hole 341 is provided in order to expose the base layer 331 of the functional surface side electrode 330. In the present embodiment, the portion of the passivation film 340 surrounding the through hole 341 covers an end edge of the base layer 331. A through hole 351 is formed in the protective film 350. The through hole 351 coincides with the through hole 341 in plan view, and is provided in order to expose the base layer 331 of the functional surface side electrode 330.

Description will now return to the functional surface side electrodes 330. The foundation layer 332 provides a foundation for forming the redistribution layer 333. The foundation layer 332 coincides in shape with the functional surface side electrode 330 in plan view. That is, the foundation layer 332 covers the portion of the base layer 331 exposed from the passivation film 340 and the protective film 350, the through hole 341 in the passivation film 340, the through hole 351 in the protective film 350, and an appropriate region of the protective film 350. The foundation layer 332 is made of Ti, TiW, Ta or the like, for example. The foundation layer 332 has a thickness of about 100 nm.

The redistribution layer 333 is a main constituent of the functional surface side electrode 330, and is larger than the base layer 331 in plan view. The redistribution layer 333 is not particularly limited in material, and is made of Cu in the present embodiment. The redistribution layer 333 has a thickness of about 10 µm, for example.

The functional surface side raised part 334 is formed on the redistribution layer 333 and projects in the direction in which the functional surface 310 faces. The functional surface side raised part 334 is not particularly limited in material as long as the material is a conductive material, and is made of Cu in the present embodiment. Also, the functional surface side raised part 334 is not particularly limited in shape, and has a columnar shape in the present embodiment. The functional surface side raised part 334 has a diameter of 25 µm to 200 µm and a height of 10 µm to 500 µm. In plan view, the functional surface side raised part 334 is disposed in a position that avoids the base layer 331 so as to not overlap with the base layer 331. Also, the functional surface side raised part 334 overlaps with the passivation film 340 and the protective film 350 in plan view.

Also, in the present embodiment, as shown in FIG. 1, a plurality of functional surface side raised parts 334 are formed on the three functional surface side electrodes 330 that oppose the opposing parts 110 of the leads 101, 102 and 103. Eight functional surface side raised parts 334 are formed in four rows and two columns on the functional surface side raised part 334 that opposes the opposing part 110 of the lead 101. Four functional surface side raised parts 334 are formed in two rows and two columns on the functional surface side electrodes 330 that oppose the opposing parts 110 of the leads 102 and 103. One functional surface side raised part 334 each is formed on the functional surface side electrodes 330 that oppose the opposing parts 110 of the leads 104 to 107.

The joining promotion layer 335 constitutes the uppermost layer of the functional surface side electrode 330, and, in the present embodiment, covers the functional surface side raised parts 334 and the redistribution layer 333. The joining promotion layer 335 is for strengthening the junction between the functional surface side electrodes 330 and the opposing parts 110 of the leads 101 to 107. The joining promotion layer 335 contains at least one of Ni and Pd, and, in the present embodiment, consists of a Ni layer that directly covers the functional surface side raised parts 334 and the redistribution layer 333 and a Pd layer laminated on this Ni layer. The joining promotion layer 335 has a thickness of about 100 nm to 10 µm, for example. Also, apart from the materials given above, Cu, Al, Ti, Au or the like can be employed as appropriate as the material of the joining promotion layer 335.

The functional surface side electrodes 330 are joined to the opposing parts 110 of the leads 101 to 107 by solid state bonding. More specifically, the top faces of the functional surface side raised parts 334 are solid state bonded to the joining surfaces 113 of the opposing parts 110. Note that, in the present embodiment, a configuration is adopted in which the joining promotion layer 335 is interposed between the functional surface side raised parts 334 and the joining surfaces 113 of the opposing parts 110. Note that a joining promotion layer may be formed on the joining surfaces 113 of the opposing parts 110, in addition to or instead of forming the joining promotion layer 335 on the functional surface side electrodes 330.

The sealing resin 400 entirely covers the semiconductor element 300 and covers the leads 101 to 107 except for the terminal parts 120. The sealing resin 400 is made of an insulating material, and, in the present embodiment, is made of a black epoxy resin, for example. In the present embodiment, the sealing resin 400 is also filled between the joining surfaces 113 of the opposing parts 110 and the joining promotion layers 335 of the functional surface side electrodes 330, in areas avoiding the functional surface side raised parts 334.

Next, an exemplary method for making the semiconductor device A1 will be described hereinafter.

Figure 7:
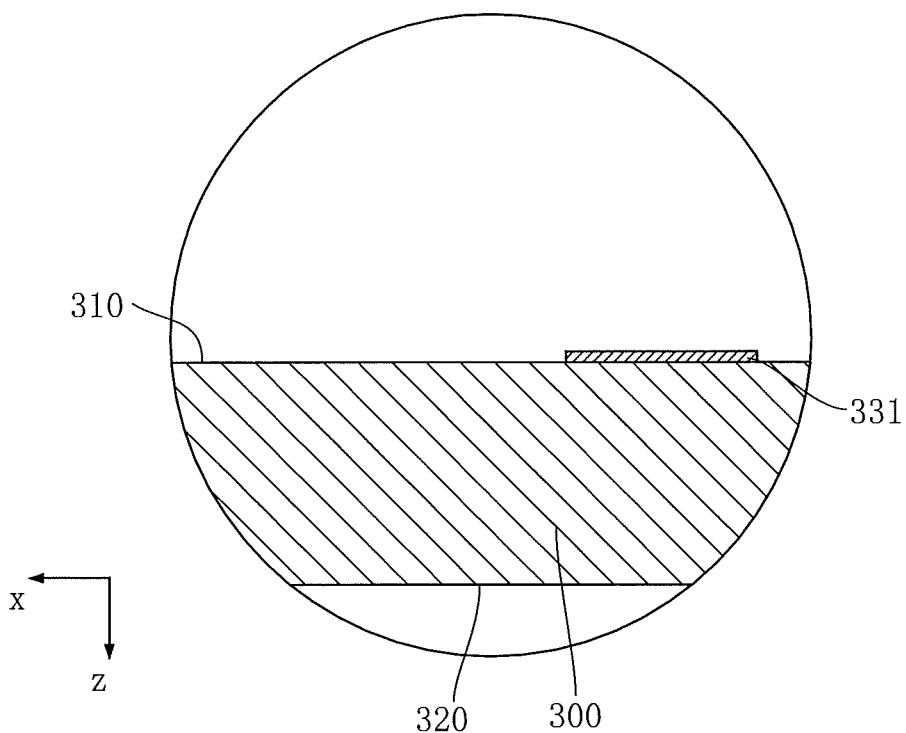
FIG. 7 is an enlarged cross-sectional view showing a main section of an exemplary method for making the semiconductor device of FIG. 1.

First, as shown in FIG. 7, the base layer 331 is formed on the semiconductor element 300. The base layer 331 is electrically connected to an appropriate place of a functional circuit (not shown) formed on the functional surface 310 of the semiconductor element 300. The base layer 331 is patterned by plating using Al, for example. The base layer 331 has a thickness of 0.1 µm to 10 µm, for example.

Figure 8:
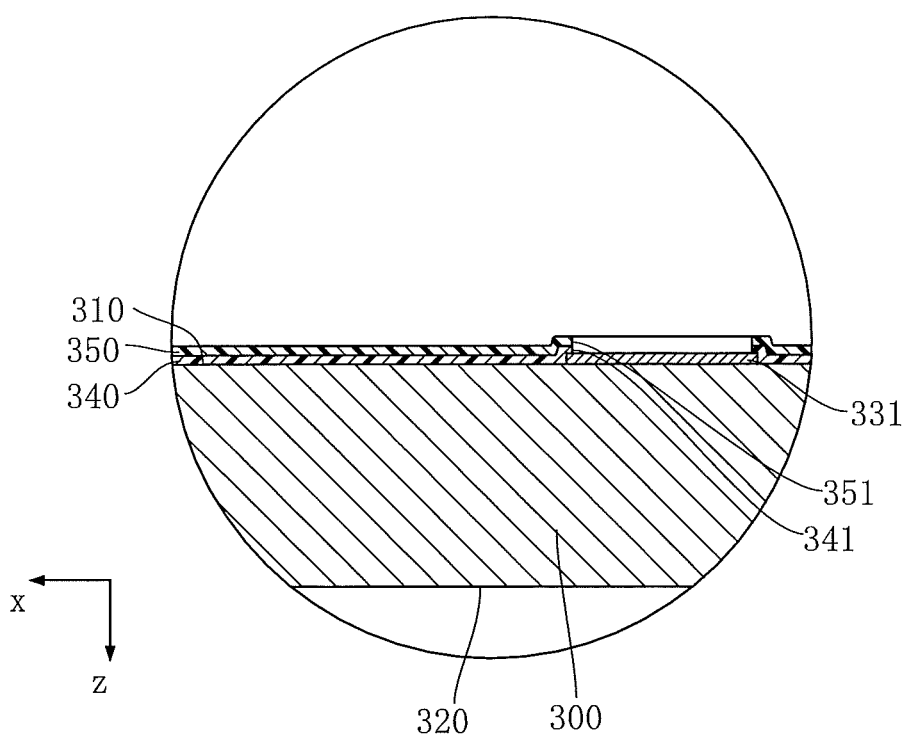
FIG. 8 is an enlarged cross-sectional view showing a main section of an exemplary method for making the semiconductor device of FIG. 1.

Next, as shown in FIG. 8, the passivation film 340 and the protective film 350 are formed. Formation of the passivation film 340 and the protective film 350 is performed by forming a SiN film and a polyimide film, for example, over the entire functional surface 310. The SiN film has a thickness of 200 nm to 3 µm, for example. Also, the polyimide film has a thickness of about 5 µm, for example. The through hole 341 and the through hole 351 that expose the base layer 331 are then formed in the SiN film and the polyimide film by patterning such as etching. The passivation film 340 and the protective film 350 are thereby obtained.

Figure 9:
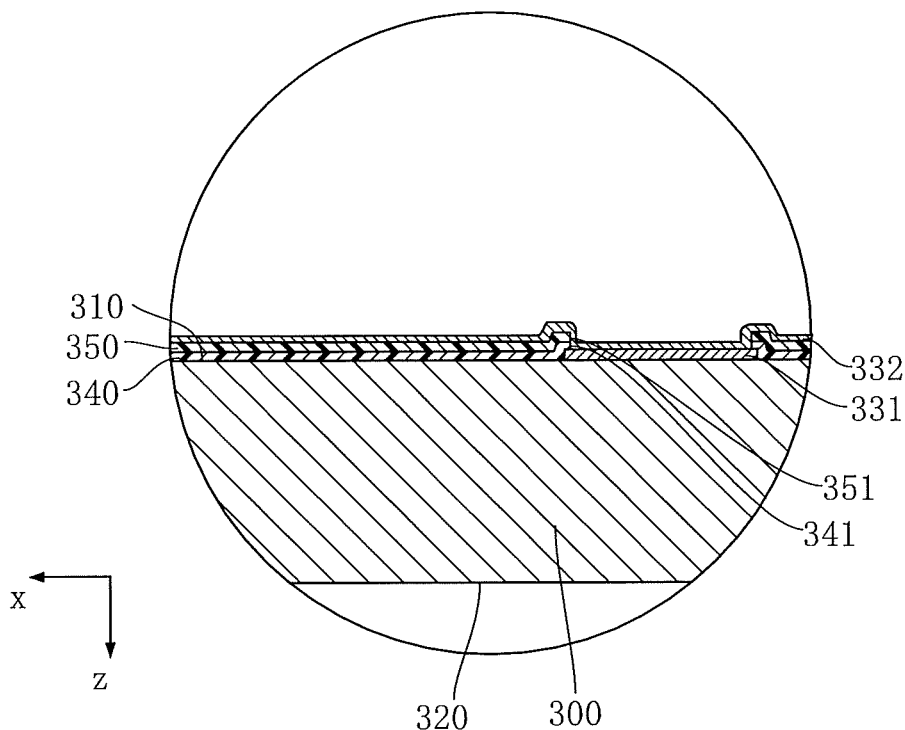
FIG. 9 is an enlarged cross-sectional view showing a main section of an exemplary method for making the semiconductor device of FIG. 1.

Next, as shown in FIG. 9, the foundation layer 332 is formed. Specifically, a film is made of Ti, TiW, Ta or the like and having a thickness of about 100 nm is formed, so as to cover the portion of the base layer 331 that is exposed from the passivation film 340 and the protective film 350, the through hole 341, the through hole 351, and the protective film 350. The film forming method is not particularly limited, and CVD, spattering or the like can be used. Note that the shape, size and disposition of the foundation layer 332 correspond to the shape, size and disposition of the functional surface side electrodes 330 to be formed.

Figure 10:
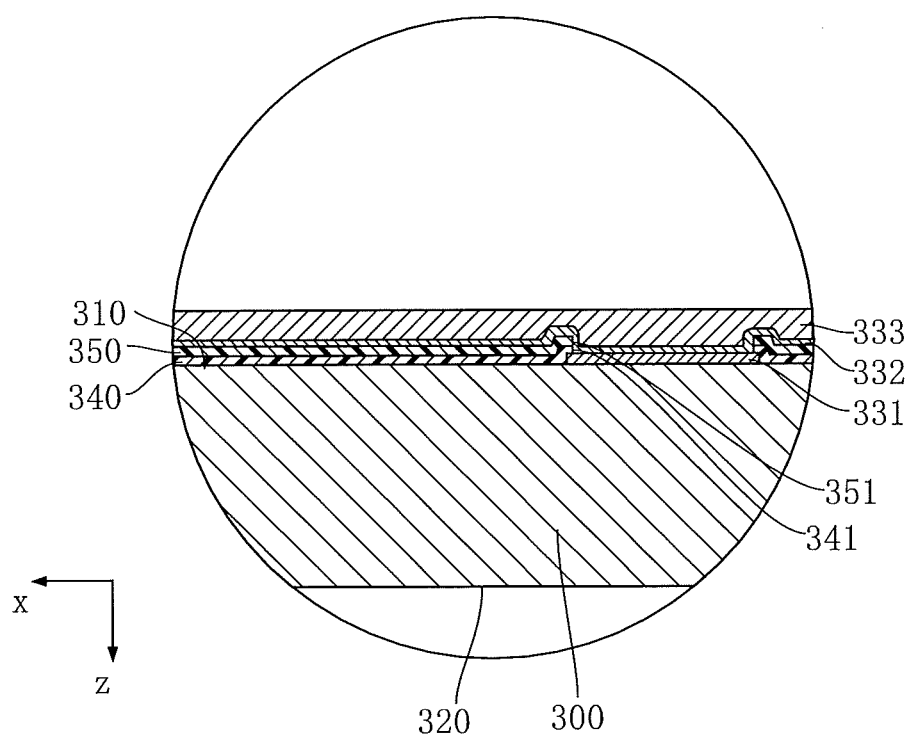
FIG. 10 is an enlarged cross-sectional view showing a main section of an exemplary method for making the semiconductor device of FIG. 1.

Next, as shown in FIG. 10, the redistribution layer 333 is formed. The redistribution layer 333 is formed by electrolytic plating using the foundation layer 332, for example. The redistribution layer 333 is made of Cu, for example, and has a thickness of about 10 µm. The shape, size and disposition of the redistribution layer 333 substantially match the foundation layer 332.

Figure 11:
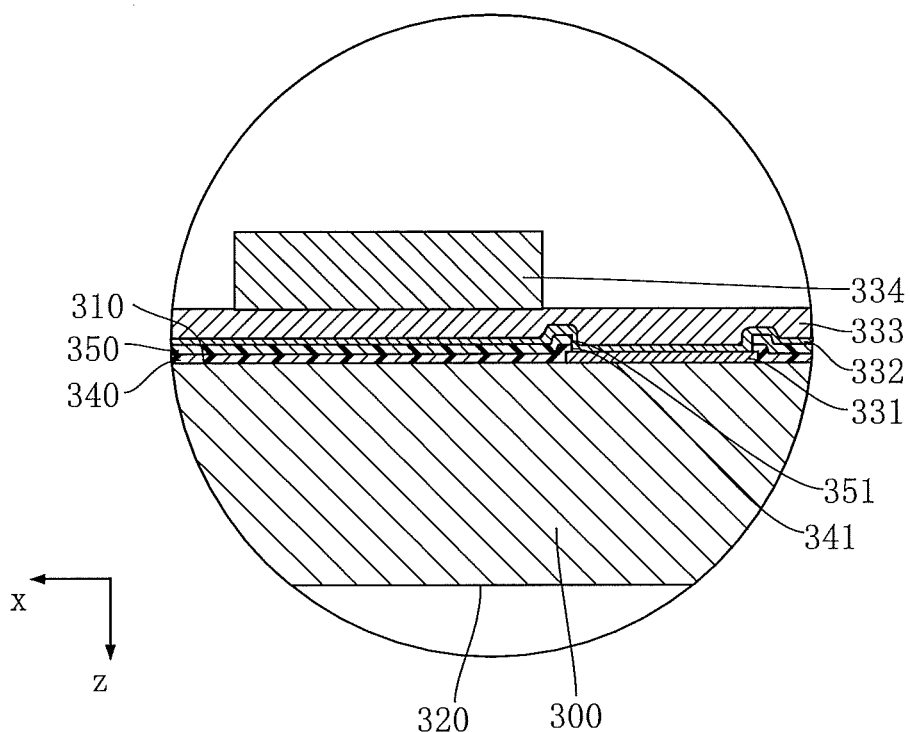
FIG. 11 is an enlarged cross-sectional view showing a main section of an exemplary method for making the semiconductor device of FIG. 1.

Next, as shown in FIG. 11, the functional surface side raised parts 334 are formed. The functional surface side raised parts 334 are formed through a combination of plating, sputtering and patterning, for example. For example, a mask having openings that coincide with the shape of the functional surface side raised parts 334 in plan view is prepared, and Cu is adhered by plating or sputtering using this mask. Alternatively, the functional surface side raised parts 334 are formed by performing processing such as etching on a Cu film formed by plating or sputtering.

Figure 12:
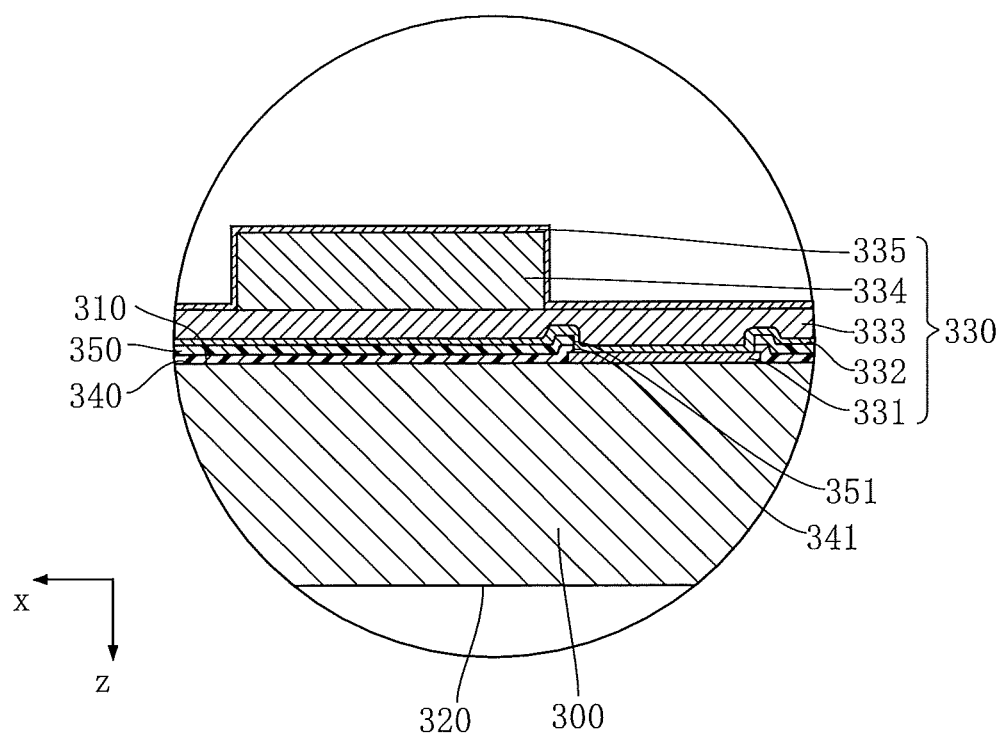
FIG. 12 is an enlarged cross-sectional view showing a main section of an exemplary method for making the semiconductor device of FIG. 1.

Next, as shown in FIG. 12, the joining promotion layer 335 is formed. Formation of the joining promotion layer 335 is performed by sequentially forming a Ni layer and a Pd layer by plating, for example, so as to cover the redistribution layer 333 and the functional surface side raised parts 334. The joining promotion layer 335 has a thickness of 100 nm to 10 µm, for example.

Figure 13:
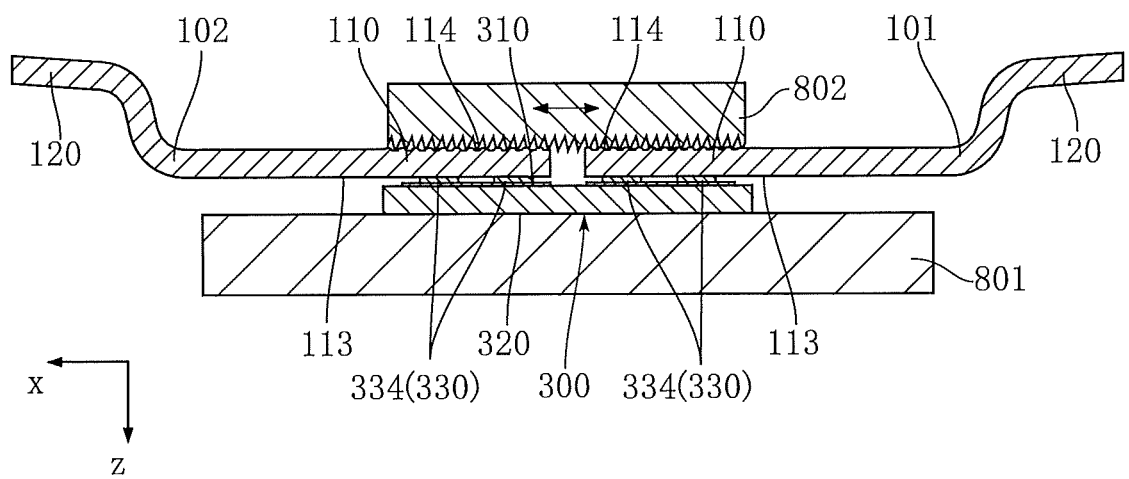
FIG. 13 is a cross-sectional view showing an exemplary method for making the semiconductor device of FIG. 1.
Figure 14:
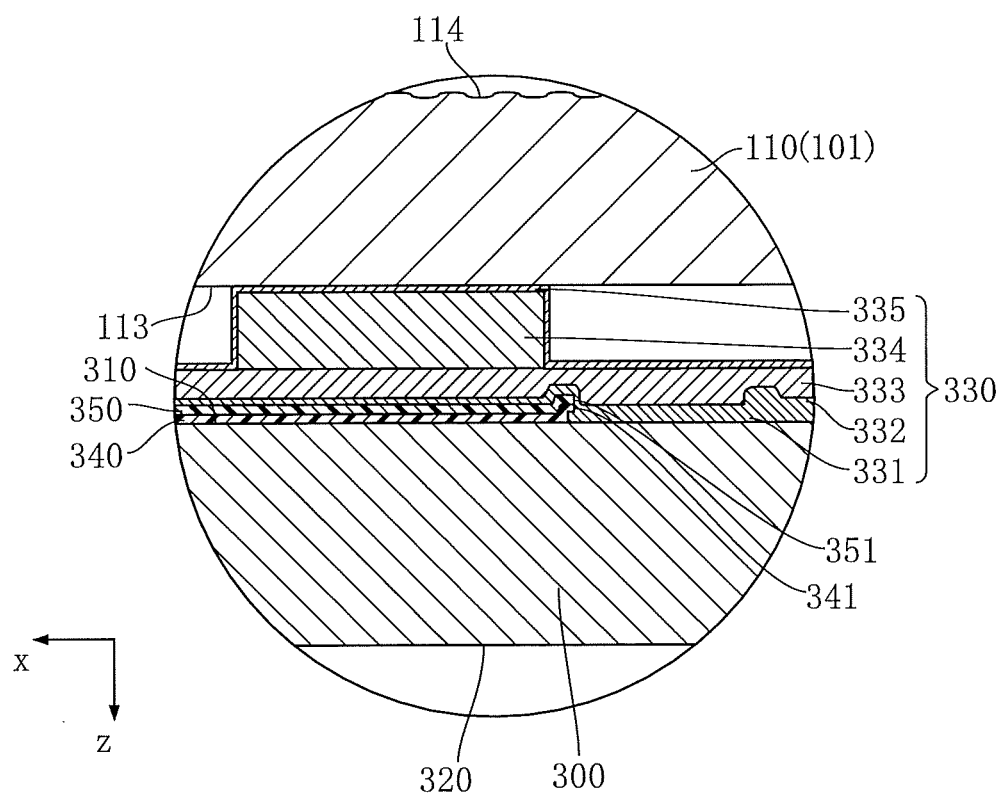
FIG. 14 is an enlarged cross-sectional view showing a main section of an exemplary method for making the semiconductor device of FIG. 1.

Next, as shown in FIG. 13, the joining surfaces 113 of the opposing parts 110 of the leads 101 to 107 are joined to the plurality of functional surface side electrodes 330 of the semiconductor element 300. This junction is realized by fixing the semiconductor element 300 to a table 801, and pressing a jig 802 against the back surfaces 114 of the opposing parts 110 of the leads 101 to 107, for example. A plurality of protrusions are formed in a lower surface of the jig 802 in the diagram. The jig 802 is vibrated in an xy plane, with a predetermined pressing force being applied to the leads 101 to 107 by the jig 802. This vibration is low frequency compared with ultrasonic waves, for example, and is, for example, 100 Hz or less, and specifically 50 Hz to 60 Hz. As shown in FIG. 14, the functional surface side raised parts 334 are thereby solid state bonded to the opposing parts 110 with the joining promotion layer 335 sandwiched therebetween. Also, the back surfaces 114 of the opposing parts 110 are formed to have unevenness with the marks left by the jig 802 having been pressed thereagainst.

Thereafter, the semiconductor device A1 is obtained by undergoing a process for forming the sealing resin 400.

Next, workings of the semiconductor device A1 will be described.

According to the present embodiment, the functional surface side raised parts 334 are joined to the opposing parts 110 of the leads 101 to 107 by solid state bonding. Solid state bonding involves both sides being directly joined to each other and does not require a joining medium interposed between both sides, such as wire or solder. Also, the solid state bonding of all of the functional surface side raised parts 334 and the opposing parts 110 of the leads 101 to 107 can be performed collectively. The manufacturing efficiency of the semiconductor device A1 can thereby be improved. Also, the joining strength of the functional surface side raised parts 334 with the opposing parts 110 of the leads 101 to 107 can be enhanced.

As a result of providing the functional surface side raised parts 334, it is possible to reduce the area of the junction between the functional surface side electrodes 330 and the opposing parts 110 of the leads 101 to 107. The force that needs to be applied in order to obtain a predetermined joining pressure at the time of solid state bonding can thereby be reduced. The semiconductor element 300 can thereby be prevented from being unintentionally damaged or the like. Also, as a result of providing the functional surface side raised parts 334, the sealing resin 400 can be reliably filled between the functional surface 310 of the semiconductor element 300 and the joining surfaces 113 of the opposing parts 110 of the leads 101 to 107. Places that need to be insulated in the semiconductor device A1 can thereby be more reliably insulated.

As a result of the functional surface side raised parts 334 not overlapping with the base layer 331 in plan view, it is possible to avoid the force at the time of solid state bonding being excessively loaded on the Si forming a main constituent of the semiconductor element 300. Also, as a result of the functional surface side raised parts 334 being overlapped with the passivation film 340 and the protective film 350 in plan view, the force at the time of solid state bonding can be absorbed by the passivation film 340 and the protective film 350.

As a result of providing the joining promotion layer 335, solid state bonding of the functional surface side raised parts 334 to the opposing parts 110 can be performed more reliably.

FIGS. 15 to 31 show other embodiments of the present invention. Note that, in these diagrams, elements that are the same as or similar to the above embodiment are given the same reference numerals.

FIGS. 15 to 20 show a semiconductor device that is based on a second embodiment of the present invention. A semiconductor device A2 of the present embodiment is provided with leads 101 to 107, a semiconductor element 300, and a sealing resin 400.

Figure 15:
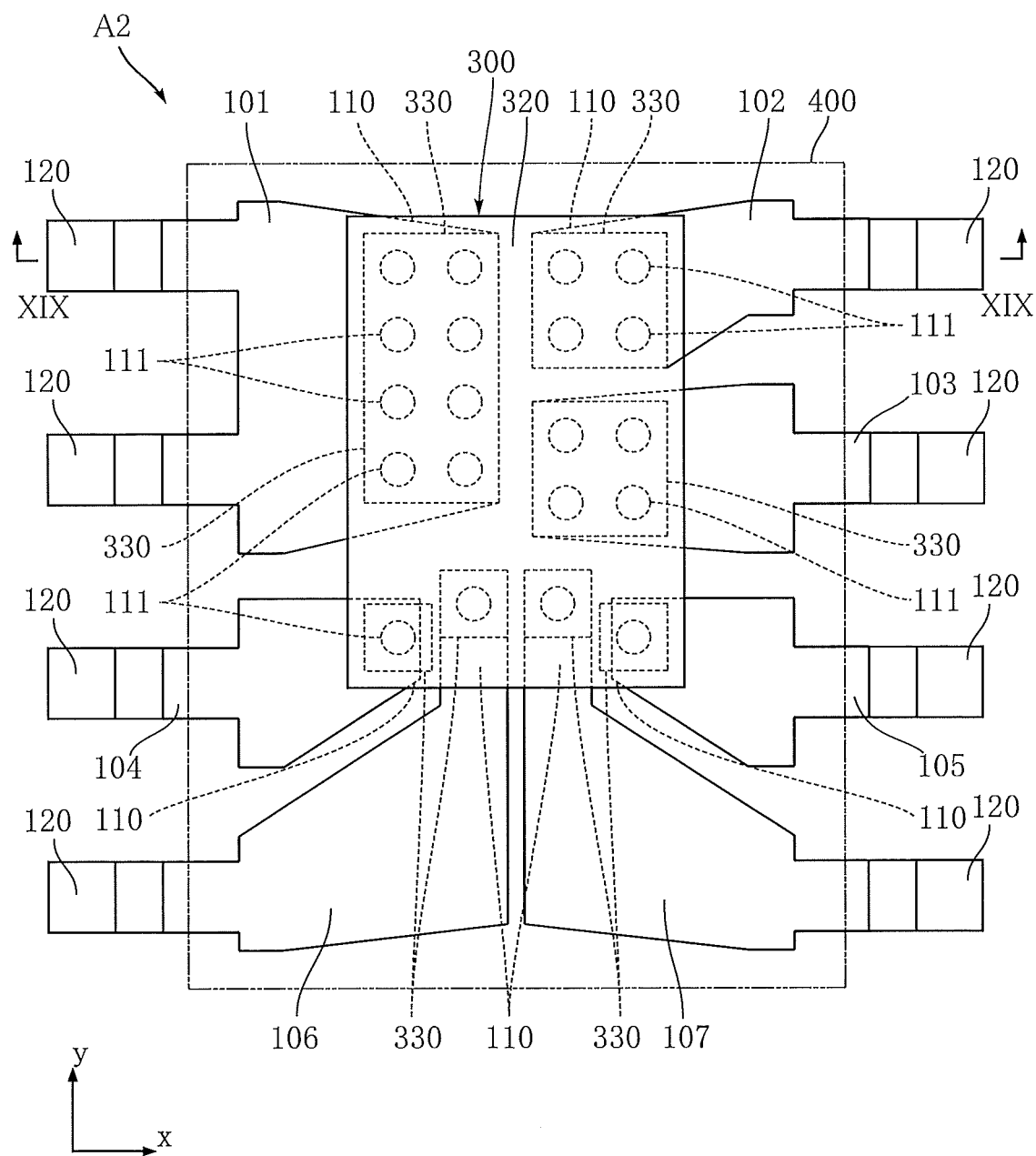
FIG. 15 is a plan view showing a semiconductor device that is based on a second embodiment of the present invention.
Figure 16:
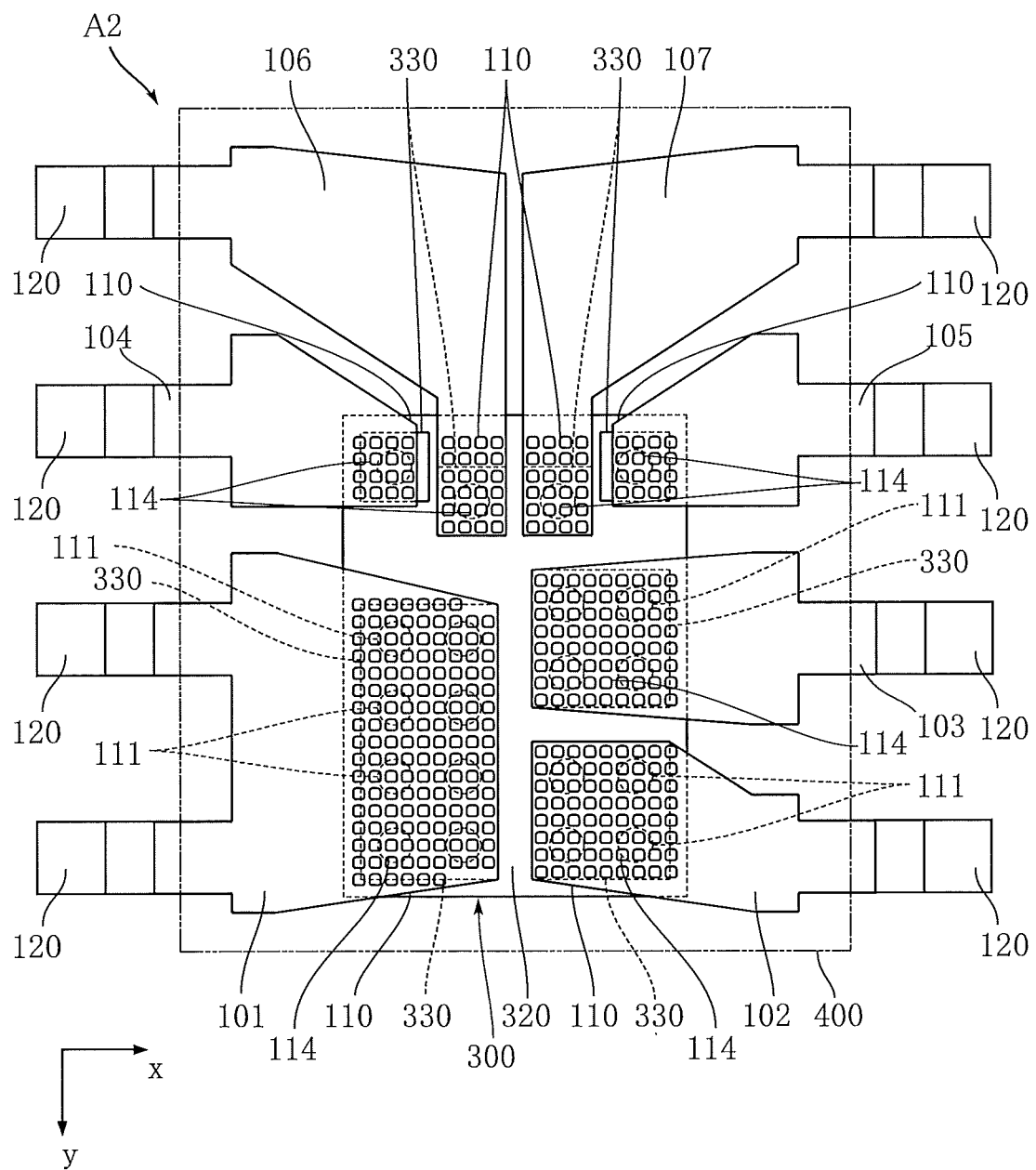
FIG. 16 is a bottom view showing the semiconductor device of FIG. 15.
Figure 17:
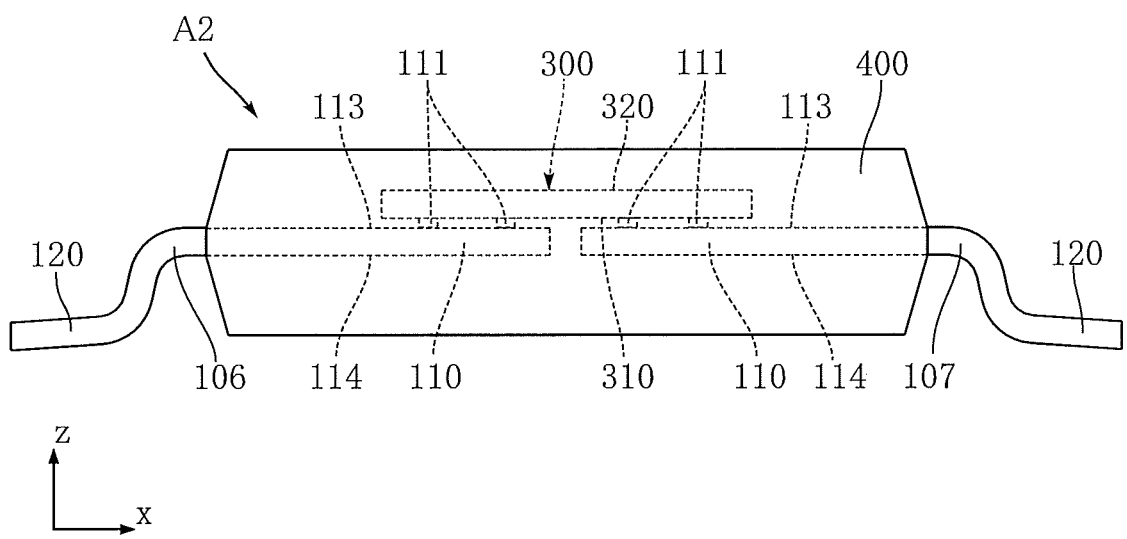
FIG. 17 is a front view showing the semiconductor device of FIG. 15.
Figure 18:
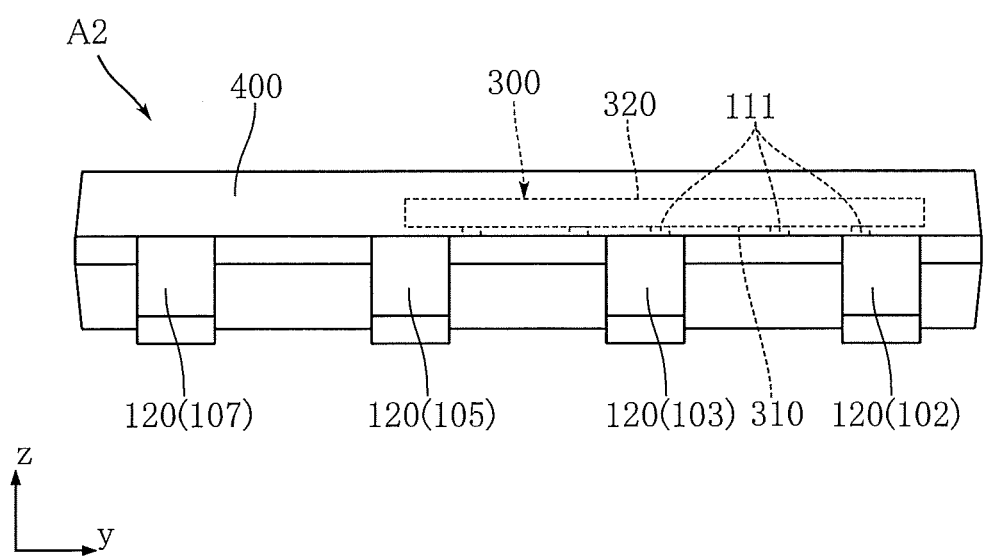
FIG. 18 is a side view showing the semiconductor device of FIG. 15.
Figure 19:
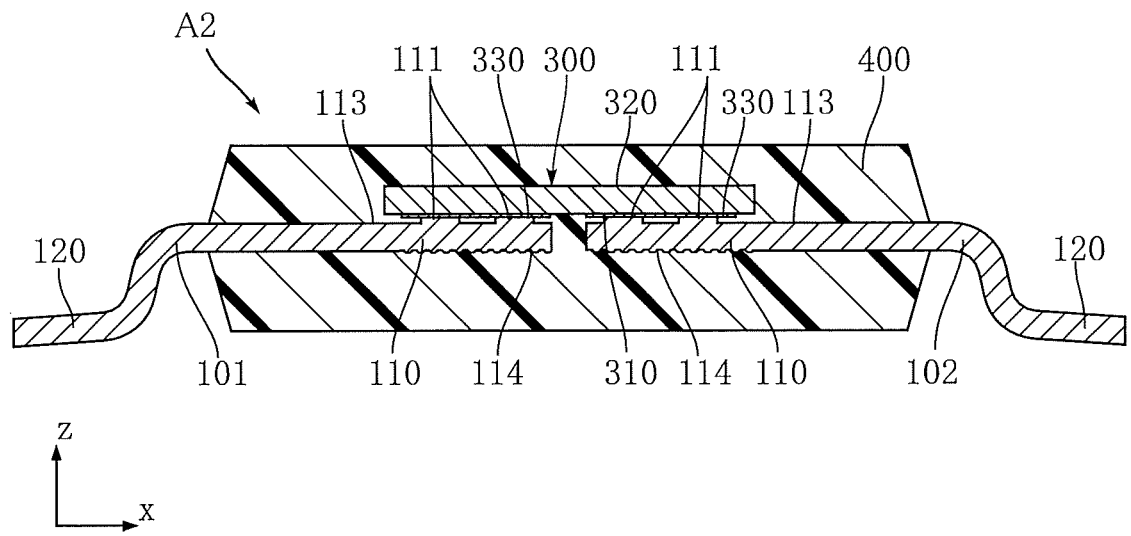
FIG. 19 is a cross-sectional view along a line XIX-XIX in FIG. 1.
Figure 20:
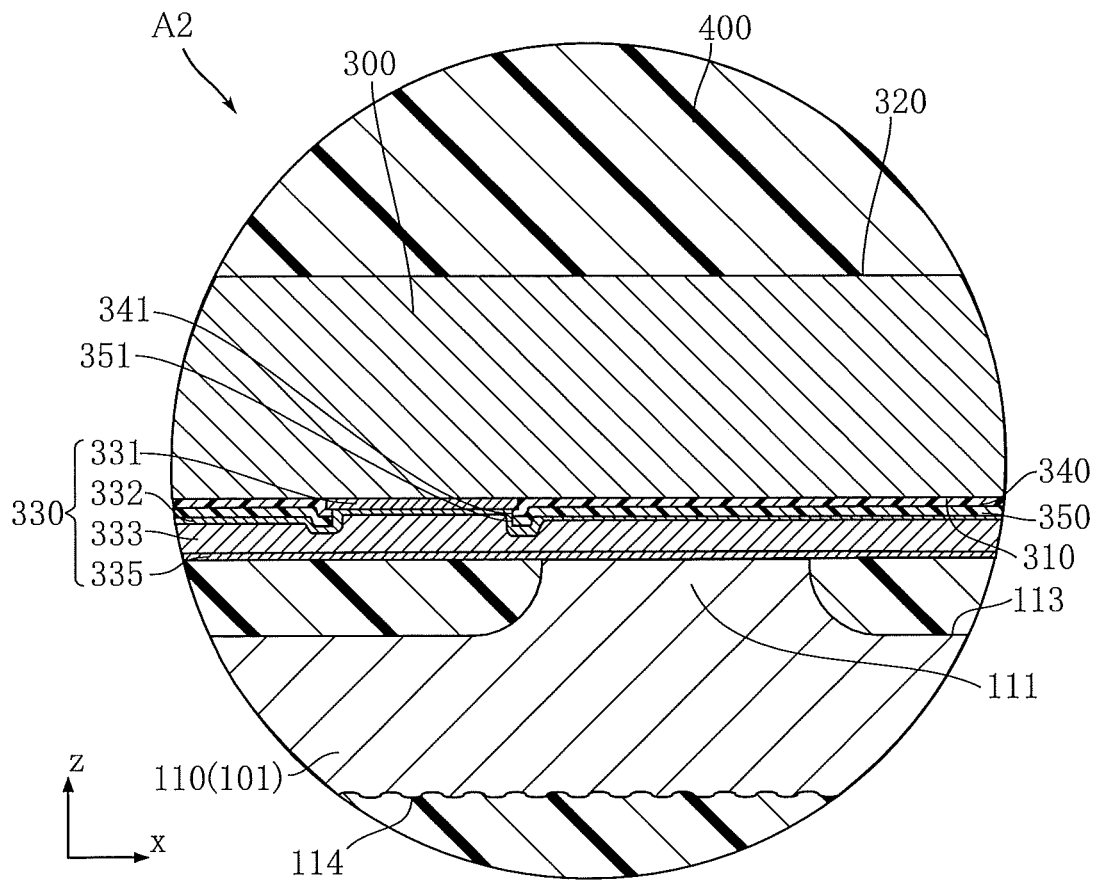
FIG. 20 is an enlarged cross-sectional view showing a main section of the semiconductor device of FIG. 15.
Figure 21:
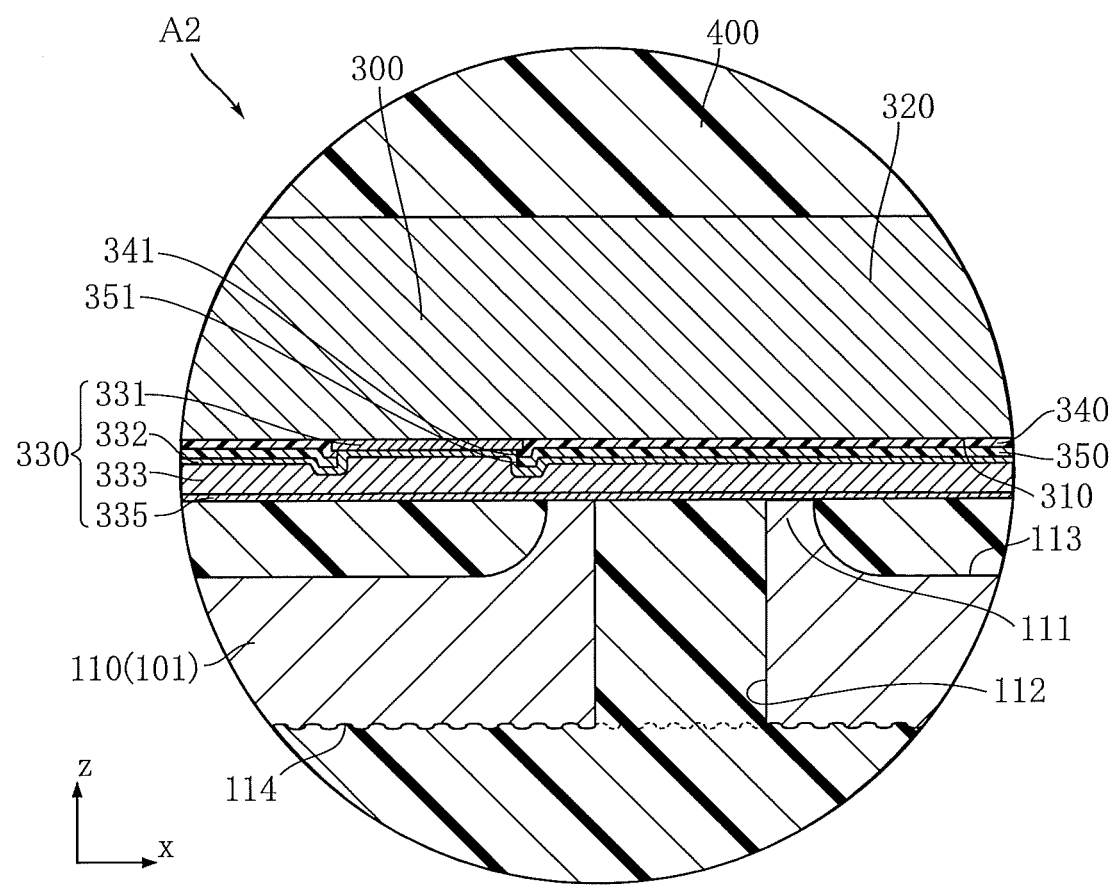
FIG. 21 is an enlarged cross-sectional view showing a main section of a modification of the semiconductor device of FIG. 15.
Figure 22:
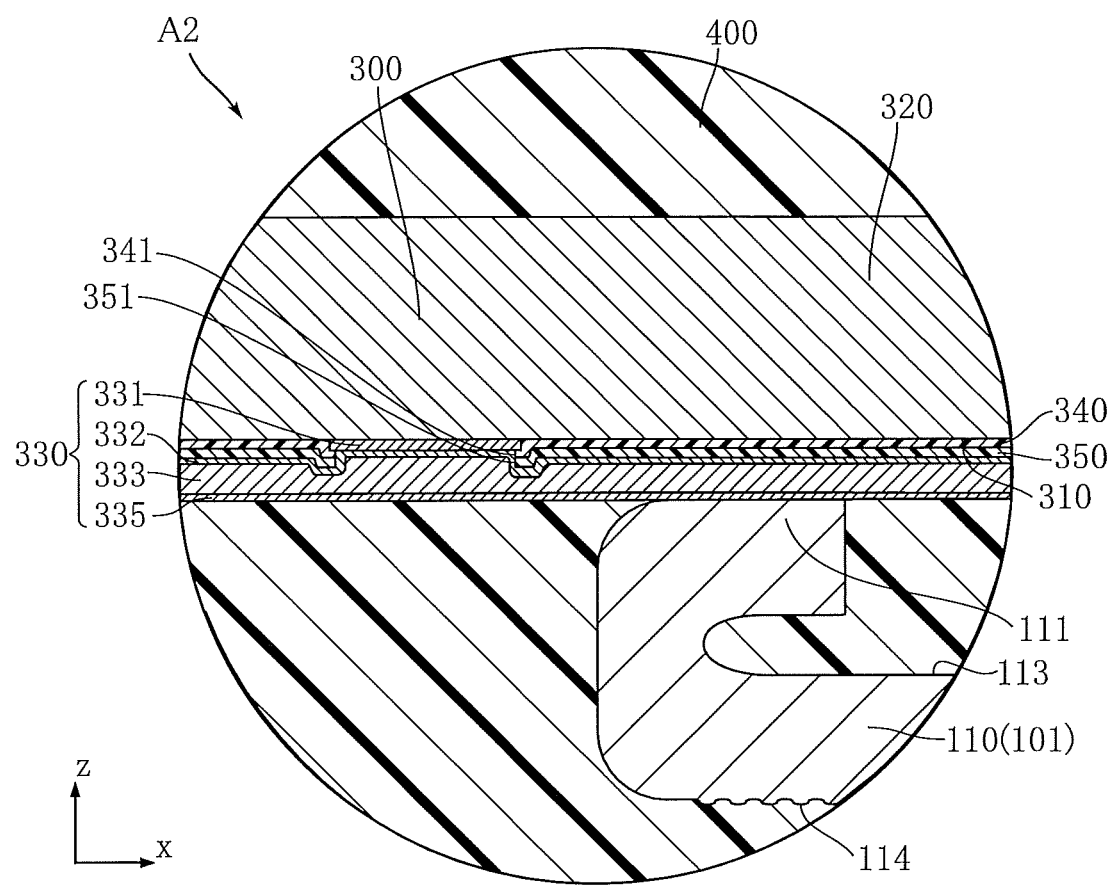
FIG. 22 is an enlarged cross-sectional view showing a main section of another modification of the semiconductor device of FIG. 15.
Figure 23:
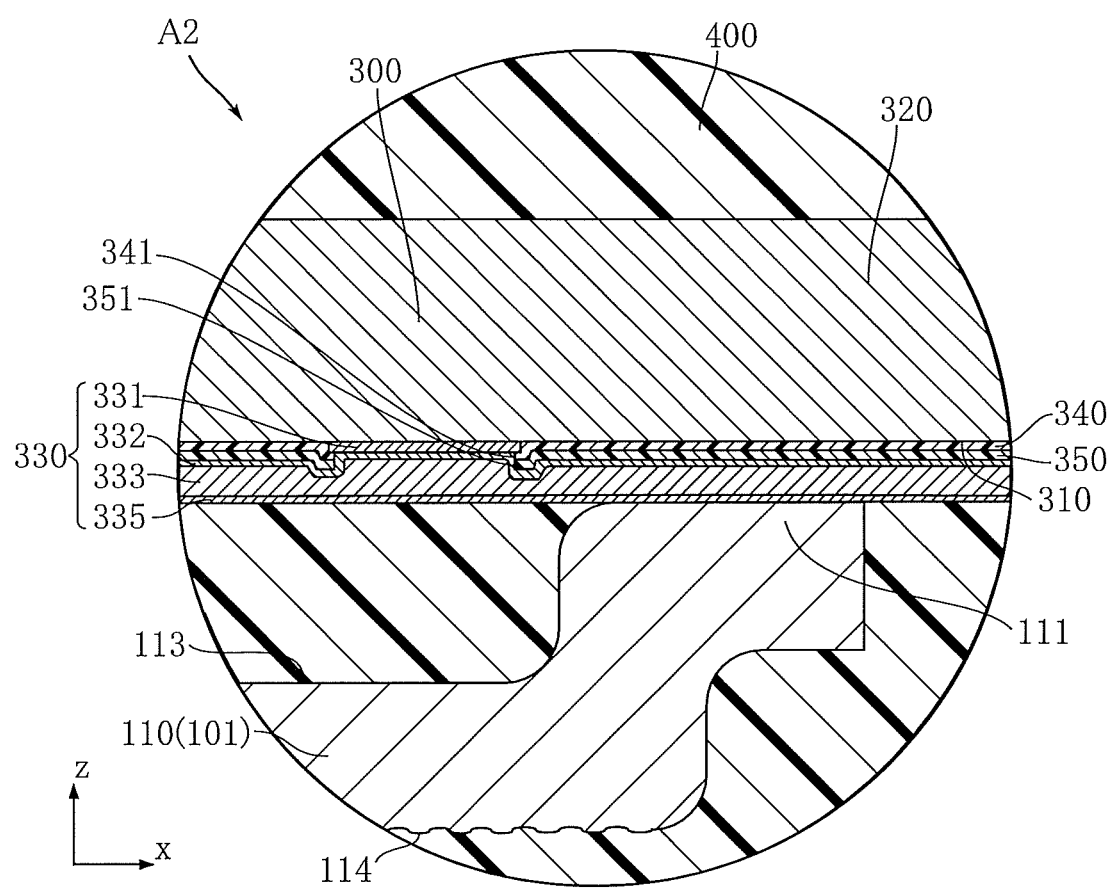
FIG. 23 is an enlarged cross-sectional view showing a main section of another modification of the semiconductor device of FIG. 15.
Figure 24:
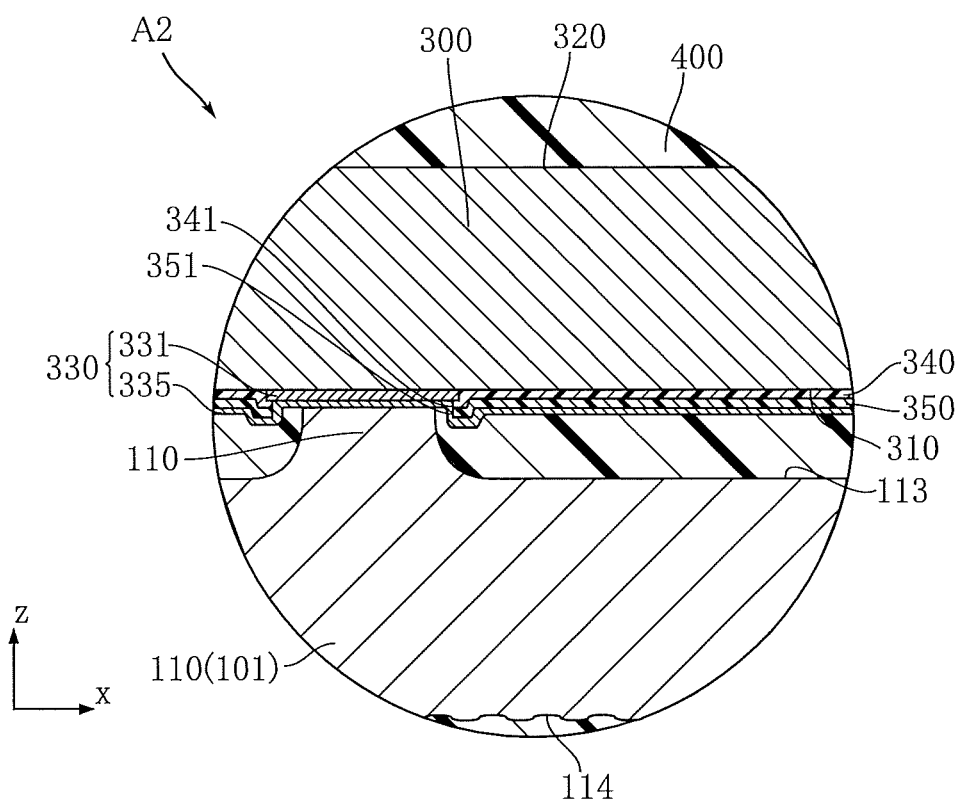
FIG. 24 is an enlarged cross-sectional view showing a main section of another modification of the semiconductor device of FIG. 15.

FIG. 15 is a plan view showing the semiconductor device A2. FIG. 16 is a bottom view showing the semiconductor device A2. FIG. 17 is a front view showing the semiconductor device A2. FIG. 18 is a side view showing the semiconductor device A2. FIG. 19 is a cross-sectional view along a line XIX-XIX in FIG. 15. FIG. 20 is an enlarged cross-sectional view showing a main section of the semiconductor device A2.

The leads 101 to 107 are examples of a conduction supporting member as referred to in the present invention. The leads 101 to 107 constitute conduction paths between the semiconductor element 300 and outside the semiconductor device A2, and support the semiconductor element 300. The leads 101 to 107 are made of a metal, and are preferably made of either Cu or Ni, an alloy thereof, alloy 42, or the like. Also, a plating layer of Ti, Ag, Pd, Au or the like may be provided on the surface of the leads 101 to 107. The present embodiment will be described taking the case where the leads 101 to 107 are made of Cu as an example. The leads 101 to 107 are not particularly limited in thickness, and have, for example, a thickness of 50 μm to 500 μm, and preferably 100 μm to 150 μm.

The leads 101 to 107 each have an opposing part 110 and a terminal part 120. The opposing part 110 overlaps with the semiconductor element 300 in plan view, and opposes a functional surface side electrode 330 of the semiconductor element 300 which will be discussed later. The terminal part 120 is exposed from the sealing resin 400 and is used for mounting the semiconductor device A2 to a circuit board or the like. As shown in FIGS. 17 and 19, the leads 101 to 107 have a bent part between the opposing part 110 and the terminal part 120. Also, the lead 101 has two terminal parts 120.

As shown in FIG. 19, the opposing parts 110 have a joining surface 113 and a back surface 114. The joining surface 113 faces the functional surface side electrode 330 of the semiconductor element 300. In the present embodiment, a conduction supporting member side raised part 111 is formed on the joining surface 113 of the opposing part 110. The conduction supporting member side raised part 111 projects toward the functional surface side electrode 330 from the joining surface 113. The conduction supporting member side raised part 111 is not particularly limited in shape, and, in the present embodiment, the conduction supporting member side raised part 111 has a columnar shape. The conduction supporting member side raised part 111 has a height of 25 μm to 200 μm and a diameter of 10 μm to 500 μm. Such a conduction supporting member side raised part 111 can be formed by etching, for example. The back surface 114 faces in the opposite direction to the joining surface 113. As shown in FIGS. 16 and 20, the back surface 114 of the opposing part 110 has unevenness. This uneven portion has a depth of about 20 μm, for example.

In the present embodiment, as shown in FIG. 15, the terminal parts 120 of the leads 101, 104 and 106 project to the left in the diagram. Also, the terminal parts 120 of the leads 102, 103, 105 and 107 project to the right in the diagram. The opposing part 110 of the lead 101 is comparatively large. The opposing parts 110 of the leads 102 and 103 are smaller than the opposing part 110 of the lead 101, and are aligned in the y direction. The opposing part 110 of the lead 101 is aligned in the x direction with the opposing parts 110 of the leads 102 and 103. The opposing parts 110 of the leads 104, 105, 106 and 107 are comparatively small. The opposing parts 110 of the leads 106 and 107 are disposed so as to be aligned in the x direction toward the center in the x direction. The opposing parts 110 of the leads 104 and 105 are disposed on either side in the x direction with the opposing parts 110 of the leads 106 and 107 sandwiched therebetween.

The semiconductor element 300 is an element that exhibits the functions of the semiconductor device A2 and is not particularly limited in type, with it being possible to select from various types of elements such as a transistor, a diode or an LSI. As shown in FIG. 19, the semiconductor element 300 has a functional surface 310 and a back surface 320. The back surface 320 has formed thereon a functional circuit (not shown) that realizes the functions of the semiconductor element 300. The back surface 320 faces in the opposite direction to the functional surface 310. The semiconductor element 300 is manufactured from a wafer made of Si or the like, for example.

The semiconductor element 300 has a plurality of functional surface side electrodes 330, a passivation film 340, and a protective film 350.

The plurality of functional surface side electrodes 330 are formed on the functional surface 310 and are each electrically connected to a different one of the leads 101 to 107. In the present embodiment, seven functional surface side electrodes 330 are formed in correspondence with the leads 101 to 107. These functional surface side electrodes 330 have a common basic configuration despite differing in size and disposition.

In the present embodiment, as shown in FIG. 15, the functional surface side electrode 330 that opposes the opposing part 110 of the lead 101 is comparatively large, and has an oblong shape in plan view with the longitudinal direction being in the y direction. The two functional surface side electrodes 330 that oppose the opposing parts 110 of the leads 102 and 103 have a substantially square shape in plan view and are aligned in the y direction. The functional surface side electrode 330 that opposes the opposing part 110 of the lead 101 is aligned in the x direction with the two functional surface side electrodes 330 that oppose the opposing parts 110 of the leads 102 and 103. The four functional surface side electrodes 330 that oppose the opposing parts 110 of the leads 104, 105, 106 and 107 are comparatively small and have a substantially square shape in plan view. The two functional surface side electrodes 330 that oppose the opposing parts 110 of the leads 106 and 107 are disposed so as to be aligned in the x direction toward the center in the x direction. The two functional surface side electrodes 330 that oppose the opposing parts 110 of the leads 104 and 105 are disposed on either side in the x direction with the opposing parts 110 of the leads 106 and 107 sandwiched therebetween.

As shown in FIGS. 15, 19 and 20, the functional surface side electrodes 330 have a base layer 331, a foundation layer 332, a redistribution layer 333, and a joining promotion layer 335.

The base layer 331 contacts the functional surface 310, and is electrically connected directly to an appropriate place of the functional circuit on the functional surface 310. The functional surface 310 is made of Al, for example. The base layer 331 has a thickness of 0.1 μm to 10 μm, for example.

Here, the passivation film 340 and the protective film 350 will be described. The passivation film 340 is for preventing an excessive force from being loaded on the Si which is a main constituent of the semiconductor element 300, and is made of an insulating material such as SiN, for example. The passivation film 340 has a thickness of 200 nm to 3 μm, for example. The protective film 350 is laminated on the passivation film 340, and is for preventing an excessive force from being loaded on the Si which is a main constituent of the semiconductor element 300 and for facilitating formation of the redistribution layer 333. The protective film 350 is made of an insulating material such as polyimide, for example. The protective film 350 has a thickness of about 5 μm, for example.

A through hole 341 is formed in the passivation film 340. The through hole 341 is provided in order to expose the base layer 331 of the functional surface side electrode 330. In the present embodiment, the portion of the passivation film 340 surrounding the through hole 341 covers an end edge of the base layer 331. A through hole 351 is formed in the protective film 350. The through hole 351 coincides with the through hole 341 in plan view, and is provided in order to expose the base layer 331 of the functional surface side electrode 330.

Description will now return to the functional surface side electrodes 330. The foundation layer 332 provides a foundation for forming the redistribution layer 333. The foundation layer 332 coincides in shape with the functional surface side electrode 330 in plan view. That is, the foundation layer 332 covers the portion of the base layer 331 exposed from the passivation film 340 and the protective film 350, the through hole 341 in the passivation film 340, the through hole 351 in the protective film 350, and an appropriate region of the protective film 350. The foundation layer 332 is made of Ti, TiW, Ta or the like, for example. The foundation layer 332 has a thickness of about 100 nm.

The redistribution layer 333 is a main constituent of the functional surface side electrode 330, and is larger than the base layer 331 in plan view. The redistribution layer 333 is not particularly limited in material, and is made of Cu in the present embodiment. The redistribution layer 333 has a thickness of about 10 μm, for example.

Note that, in plan view, the conduction supporting member side raised part 111 is disposed in a position that avoids the base layer 331 so as to not overlap with the base layer 331. Also, the conduction supporting member side raised part 111 overlaps with the passivation film 340 and the protective film 350 in plan view.

Also, in the present embodiment, as shown in FIG. 15, a plurality of conduction supporting member side raised parts 111 are formed on the opposing parts 110 of the leads 101, 102 and 103. Eight conduction supporting member side raised parts 111 are formed in four rows and two columns on the opposing part 110 of the lead 101. Four conduction supporting member side raised parts 111 are formed in two rows and two columns on the opposing parts 110 of the leads 102 and 103. One conduction supporting member side raised part 111 each is formed on the opposing parts 110 of the leads 104 to 107.

The joining promotion layer 335 constitutes the uppermost layer of the functional surface side electrode 330, and, in the present embodiment, covers the redistribution layer 333. The joining promotion layer 335 is for strengthening the junction between the functional surface side electrodes 330 and conduction supporting member side raised parts 111 of the opposing parts 110 of the leads 101 to 107. The joining promotion layer 335 contains at least one of Ni and Pd, and, in the present embodiment, consists of a Ni layer that directly covers the redistribution layer 333 and a Pd layer laminated on this Ni layer. The joining promotion layer 335 has a thickness of about 100 nm to 10 μm, for example. Also, apart from the materials given above, Cu, Al, Ti, Au or the like can be employed as appropriate as the material of the joining promotion layer 335.

The functional surface side electrodes 330 are joined to the opposing parts 110 of the leads 101 to 107 by solid state bonding. More specifically, the redistribution layer 333 of the functional surface side electrodes 330 is solid state bonded to the conduction supporting member side raised parts ill of the opposing parts 110. Note that, in the present embodiment, a configuration is adopted in which the joining promotion layer 335 is interposed between the redistribution layer 333 and the conduction supporting member side raised parts 111 of the opposing parts 110. Note that a joining promotion layer may be formed on the conduction supporting member side raised parts 111 of the opposing parts 110, in addition to or instead of forming the joining promotion layer 335 on the functional surface side electrodes 330.

The sealing resin 400 entirely covers the semiconductor element 300 and covers the leads 101 to 107 except for the terminal parts 120. The sealing resin 400 is made of an insulating material, and, in the present embodiment, is made of a black epoxy resin, for example. In the present embodiment, the sealing resin 400 is also filled between the joining surfaces 113 of the opposing parts 110 and the joining promotion layers 335 of the functional surface side electrodes 330, in an area avoiding the conduction supporting member side raised parts 111.

According to the present embodiment, the functional surface side electrodes 330 are joined to the conduction supporting member side raised parts 111 of the opposing parts 110 of the leads 101 to 107 by solid state bonding. Solid state bonding involves both sides being directly joined to each other and does not require a joining medium interposed between both sides, such as wire or solder. Also, the solid state bonding of all of the functional surface side electrodes 330 and the conduction supporting member side raised parts 111 of the opposing parts 110 of the leads 101 to 107 can be performed collectively. The manufacturing efficiency of the semiconductor device A2 can thereby be improved. Also, the joining strength of the functional surface side electrodes 330 with the opposing parts 110 of the leads 101 to 107 can be enhanced.

As a result of providing the conduction supporting member side raised parts 111, it is possible to reduce the area of the junction between the functional surface side electrodes 330 and the opposing parts 110 of the leads 101 to 107. The force that needs to be applied in order to obtain a predetermined joining pressure at the time of solid state bonding can thereby be reduced. The semiconductor element 300 can thereby be prevented from being unintentionally damaged or the like. Also, as a result of providing the conduction supporting member side raised parts 111, the sealing resin 400 can be reliably filled between the functional surface 310 of the semiconductor element 300 and the joining surfaces 113 of the opposing parts 110 of the leads 101 to 107. Places that need to be insulated in the semiconductor device A2 can thereby be more reliably insulated.

As a result of the conduction supporting member side raised parts 111 not overlapping with the base layer 331 in plan view, it is possible to avoid the force at the time of solid state bonding being excessively loaded on the Si forming a main constituent of the semiconductor element 300. Also, as a result of the conduction supporting member side raised parts 111 being overlapped with the passivation film 340 and the protective film 350 in plan view, the force at the time of solid state bonding can be absorbed by the passivation film 340 and the protective film 350.

As a result of providing the joining promotion layer 335, solid state bonding of the functional surface side raised parts 334 to the opposing parts 110 can be performed more reliably.

FIGS. 25 to 30 show a semiconductor device that is based on a third embodiment of the present invention. A semiconductor device A3 of the present embodiment is provided with leads 101 to 107, a heat dissipation member 200, a semiconductor element 300, and a sealing resin 400.

Figure 25:
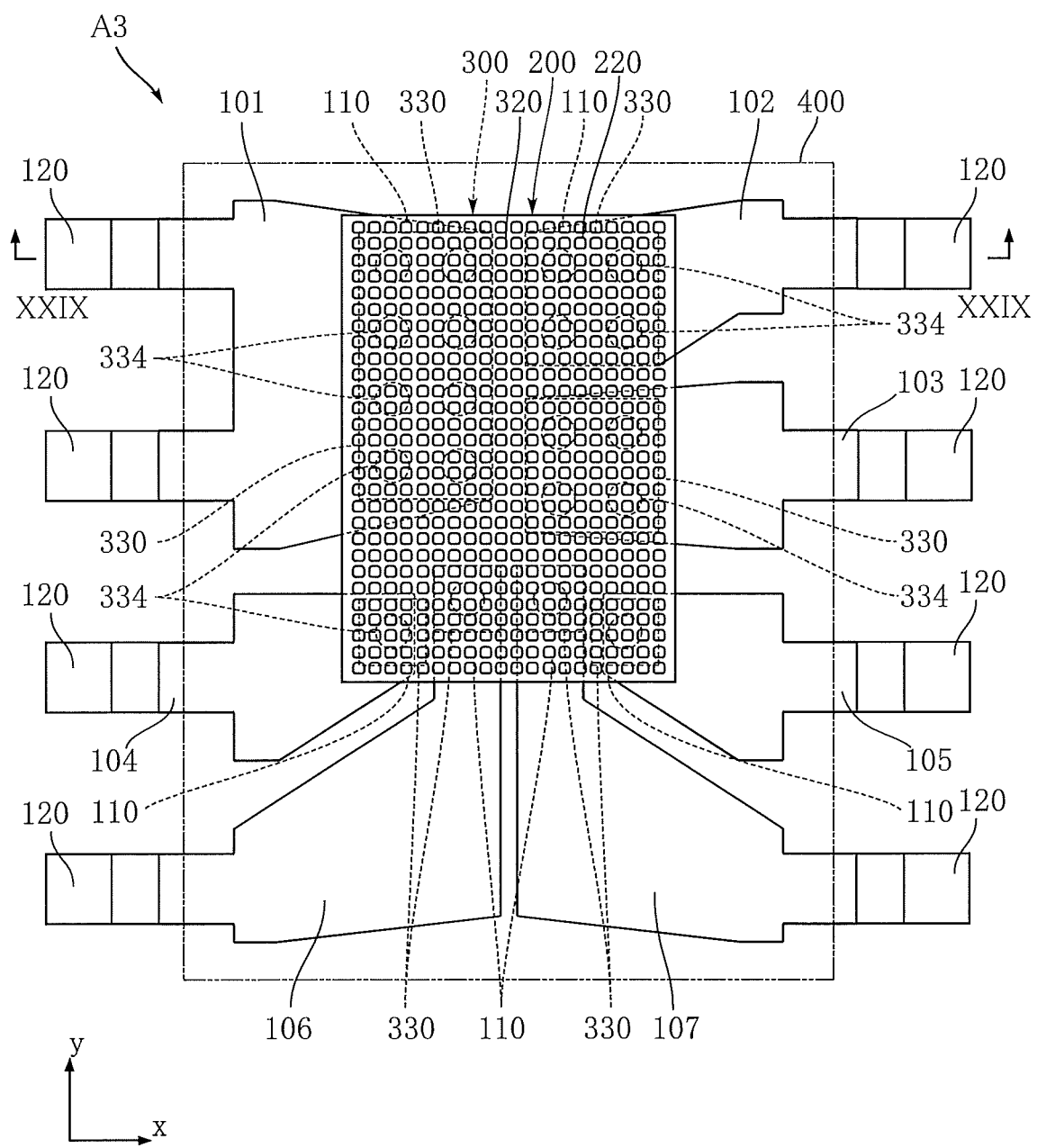
FIG. 25 is a plan view showing a semiconductor device that is based on a third embodiment of the present invention.
Figure 26:
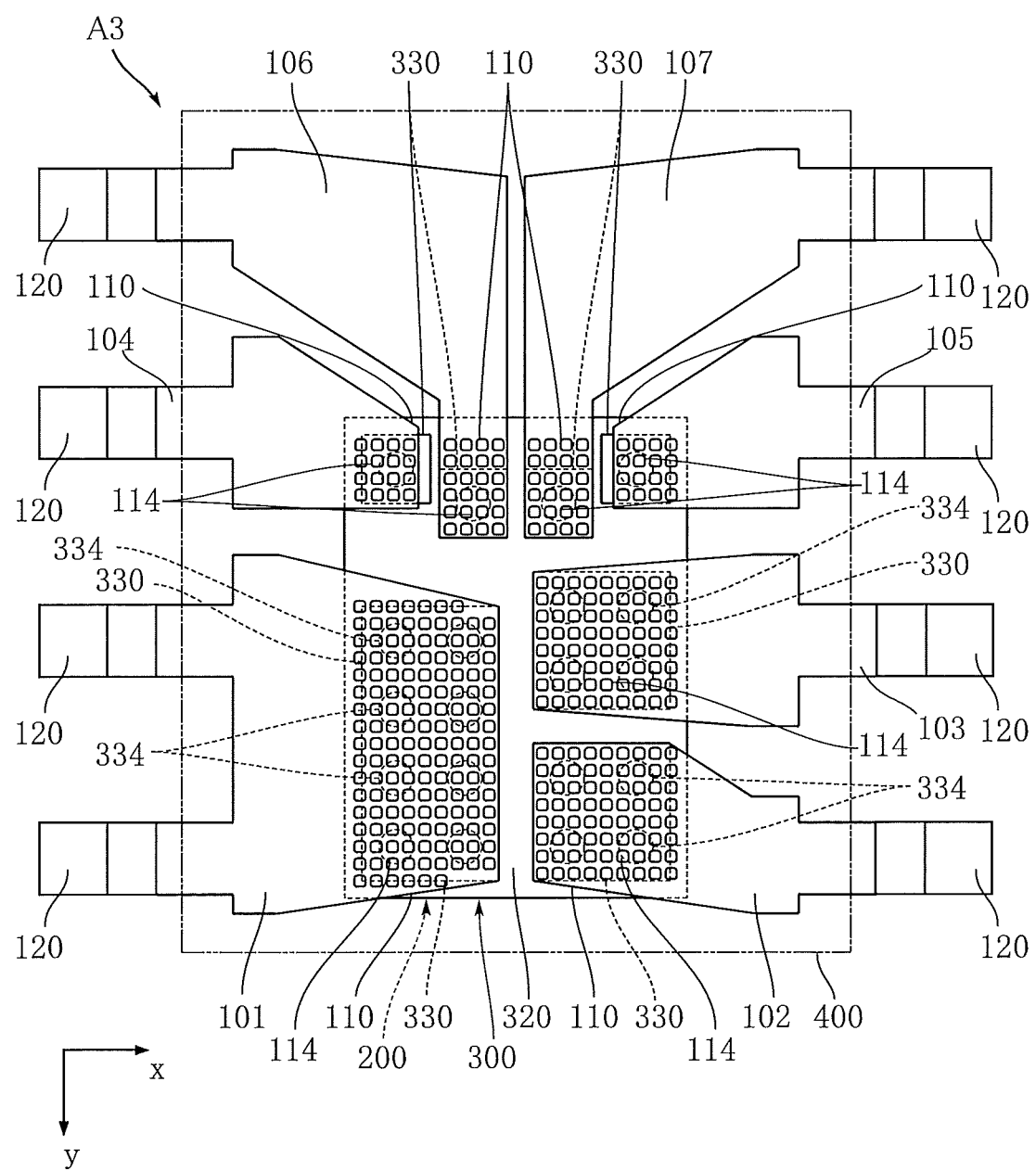
FIG. 26 is a bottom view showing the semiconductor device of FIG. 25.
Figure 27:
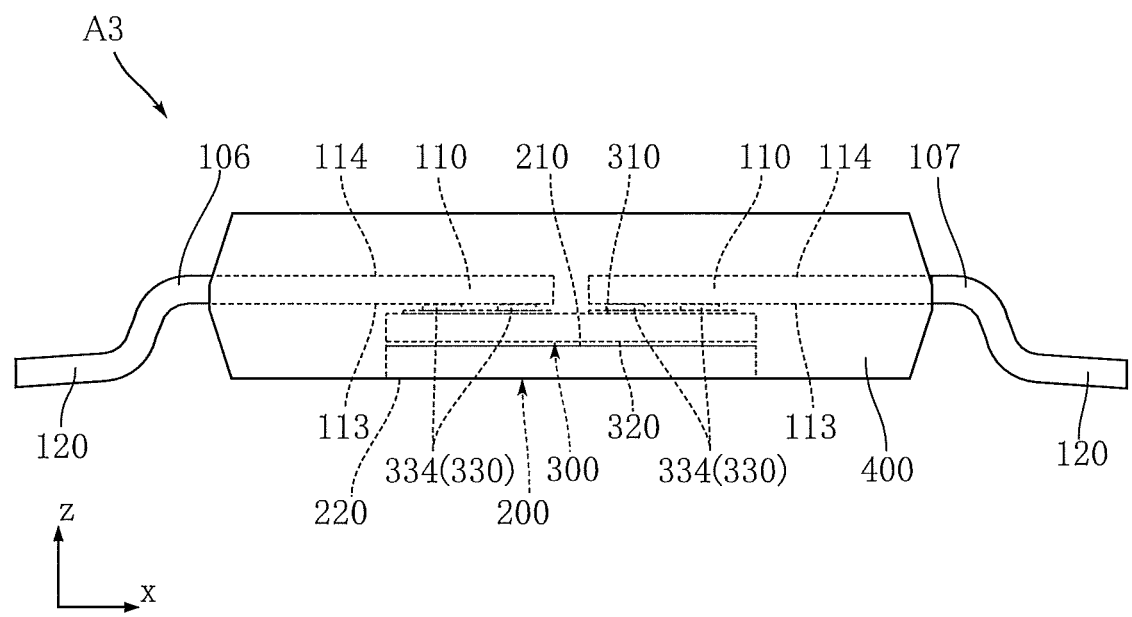
FIG. 27 is a front view showing the semiconductor device of FIG. 25.
Figure 28:
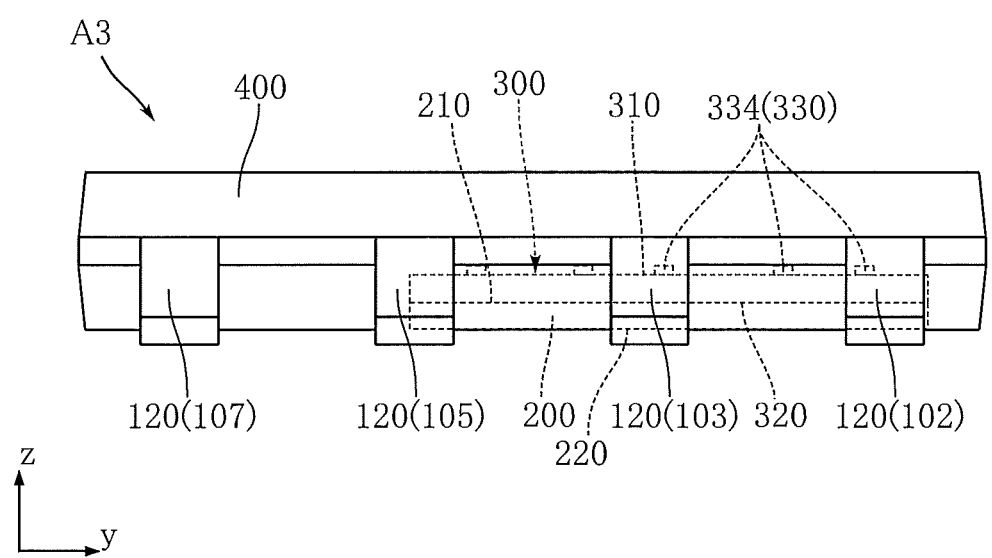
FIG. 28 is a side view showing the semiconductor device of FIG. 25.
Figure 29:
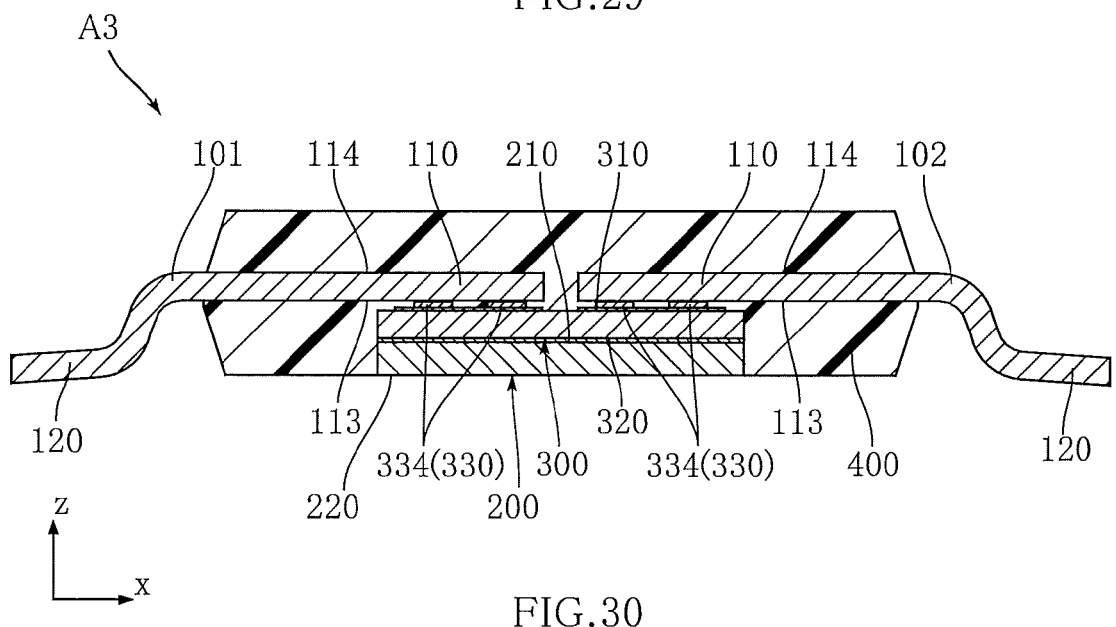
FIG. 29 is a cross-sectional view along a line XXIX-XXIX in FIG. 25.
Figure 30:
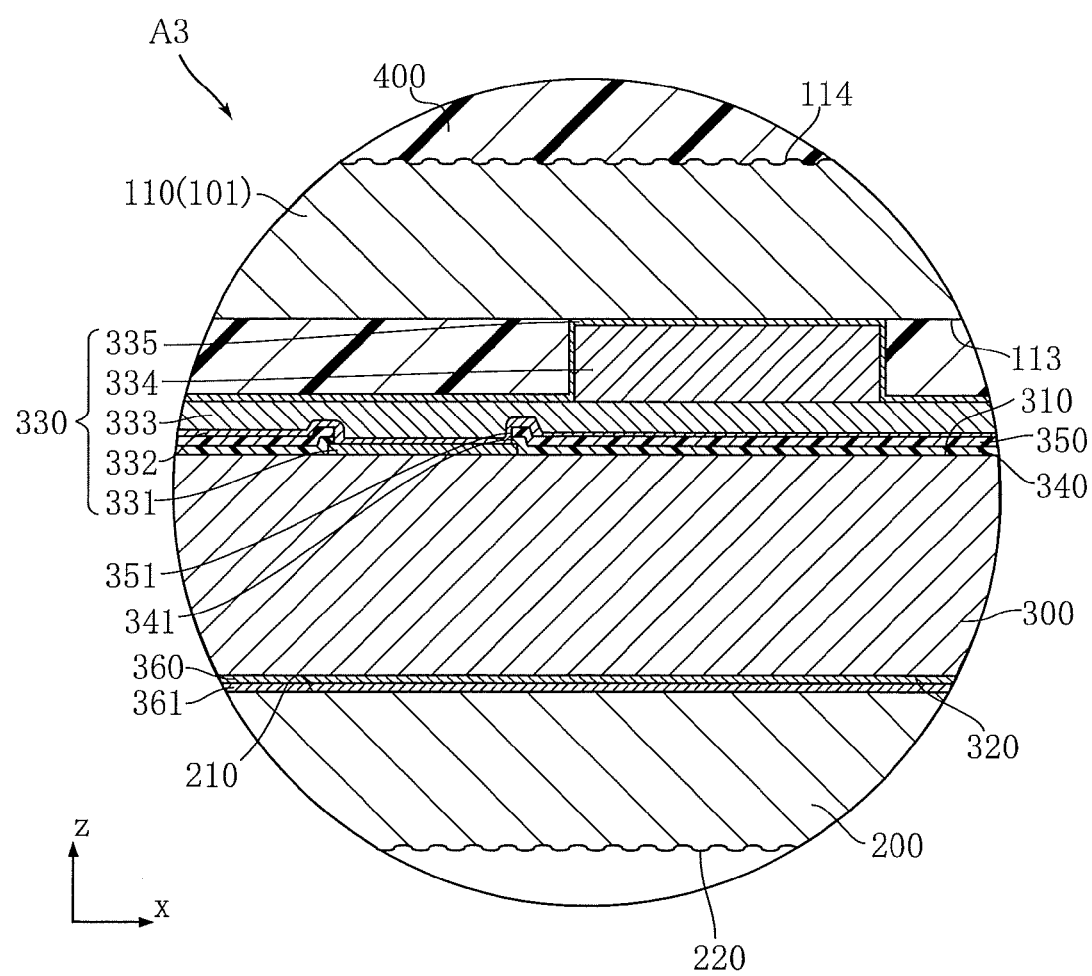
FIG. 30 is an enlarged cross-sectional view showing a main section of the semiconductor device of FIG. 25.

FIG. 25 is a plan view showing the semiconductor device A3. FIG. 26 is a bottom view showing the semiconductor device A3. FIG. 27 is a front view showing the semiconductor device A3. FIG. 28 is a side view showing the semiconductor device A3. FIG. 29 is a cross-sectional view along a line XXIX-XXIX in FIG. 25. FIG. 30 is an enlarged cross-sectional view showing a main section of the semiconductor device A3.

The leads 101 to 107 are examples of a conduction supporting member as referred to in the present invention. The leads 101 to 107 constitute conduction paths between the semiconductor element 300 and outside the semiconductor device A3, and support the semiconductor element 300. The leads 101 to 107 are made of a metal, and are preferably made of either Cu or Ni, an alloy thereof, alloy 42, or the like. Also, a plating layer of Ti, Ag, Pd, Au or the like may be provided on the surface of the leads 101 to 107. The present embodiment will be described taking the case where the leads 101 to 107 are made of Cu as an example. The leads 101 to 107 are not particularly limited in thickness, and have, for example, a thickness of 50 µm to 500 µm, and preferably 100 µm to 150 µm.

The leads 101 to 107 each have an opposing part 110 and a terminal part 120. The opposing part 110 overlaps with the semiconductor element 300 in plan view, and opposes a functional surface side electrode 330 of the semiconductor element 300 which will be discussed later. The terminal part 120 is exposed from the sealing resin 400 and is used for mounting the semiconductor device A3 to a circuit board or the like. As shown in FIGS. 27 and 29, the leads 101 to 107 have a bent part between the opposing part 110 and the terminal part 120. Also, the lead 101 has two terminal parts 120.

As shown in FIG. 29, the opposing parts 110 have a joining surface 113 and a back surface 114. The joining surfaces 113 face the functional surface side electrodes 330 of the semiconductor element 300, and are joined to the functional surface side electrodes 330. The back surfaces 114 face in the opposite direction to the joining surfaces 113.

As shown in FIGS. 26 and 30, the back surface 114 of the opposing part 110 has unevenness. This uneven portion has a depth of about 20 µm, for example.

In the present embodiment, as shown in FIG. 25, the terminal parts 120 of the leads 101, 104 and 106 project to the left in the diagram. Also, the terminal parts 120 of the leads 102, 103, 105 and 107 project to the right in the diagram. The opposing part 110 of the lead 101 is comparatively large. The opposing parts 110 of the leads 102 and 103 are smaller than the opposing part 110 of the lead 101, and are aligned in the y direction. The opposing part 110 of the lead 101 is aligned in the x direction with the opposing parts 110 of the leads 102 and 103. The opposing parts 110 of the leads 104, 105, 106 and 107 are comparatively small. The opposing parts 110 of the leads 106 and 107 are disposed so as to be aligned in the x direction toward the center in the x direction. The opposing parts 110 of the leads 104 and 105 are disposed on either side in the x direction with the opposing parts 110 of the leads 106 and 107 sandwiched therebetween.

The heat dissipation member 200 is joined to the semiconductor element 300 and is for promoting dissipation of heat from the semiconductor element 300. The heat dissipation member 200 is made of a metal, and is preferably made of either Cu or Ni, an alloy thereof, alloy 42, or the like. Also, a plating layer of Ti, Ag, Pd, Au or the like may be provided on the surface of the heat dissipation member 200. The heat dissipation member 200 is not particularly limited in thickness, and has, for example, a thickness of 50 μm to 500 μm, and preferably 100 μm to 150 μm. The present embodiment will be described taking the case where the heat dissipation member 200 is made of Cu and is formed together with the leads 101 to 107 as an example. In this case, in the manufacturing process of the semiconductor device A3, the leads 101 to 107 and the heat dissipation member 200 are formed from the same plate-like member. Also, in order to realize a disposition in which the leads 101 to 107 face the heat dissipation member 200 with the semiconductor element 300 sandwiched therebetween, a technique in which the leads 101 to 107 are rotated 180 degrees relative to the heat dissipation member 200 about a rotation axis extending along the y axis can be employed.

As shown in FIGS. 29 and 30, the heat dissipation member 200 has a joining surface 210 and a back surface 220. The joining surface 210 is joined to the semiconductor element 300. The back surface 220 faces in the opposite direction to the joining surface 210. In the present embodiment, the back surface 220 is exposed from the sealing resin 400. Also, as shown in FIGS. 25 and 30, the back surface 220 has unevenness. This uneven portion has a depth of about 20 μm, for example.

The semiconductor element 300 is an element that exhibits the functions of the semiconductor device A3 and is not particularly limited in type, with it being possible to select from various types of elements such as a transistor, a diode or an LSI. As shown in FIG. 29, the semiconductor element 300 has a functional surface 310 and a back surface 320. The back surface 320 has formed thereon a functional circuit (not shown) that realizes the functions of the semiconductor element 300. The back surface 320 faces in the opposite direction to the functional surface 310. The semiconductor element 300 is manufactured from a wafer made of Si or the like, for example.

The semiconductor element 300 has a plurality of functional surface side electrodes 330, a passivation film 340, a protective film 350, a back surface metal layer 360, and a joining promotion layer 361.

The plurality of functional surface side electrodes 330 are formed on the functional surface 310 and are each electrically connected to a different one of the leads 101 to 107. In the present embodiment, seven functional surface side electrodes 330 are formed in correspondence with the leads 101 to 107. These functional surface side electrodes 330 have a common basic configuration despite differing in size and disposition.

In the present embodiment, as shown in FIG. 25, the functional surface side electrode 330 that opposes the opposing part 110 of the lead 101 is comparatively large, and has an oblong shape in plan view with the longitudinal direction being in the y direction. The two functional surface side electrodes 330 that oppose the opposing parts 110 of the leads 102 and 103 have a substantially square shape in plan view and are aligned in the y direction. The functional surface side electrode 330 that opposes the opposing part 110 of the lead 101 is aligned in the x direction with the two functional surface side electrodes 330 that oppose the opposing parts 110 of the leads 102 and 103. The four functional surface side electrodes 330 that oppose the opposing parts 110 of the leads 104, 105, 106 and 107 are comparatively small and have a substantially square shape in plan view. The two functional surface side electrodes 330 that oppose the opposing parts 110 of the leads 106 and 107 are disposed so as to be aligned in the x direction toward the center in the x direction. The two functional surface side electrodes 330 that oppose the opposing parts 110 of the leads 104 and 105 are disposed on either side in the x direction with the opposing parts 110 of the leads 106 and 107 sandwiched therebetween.

As shown in FIGS. 25, 29 and 30, the functional surface side electrodes 330 have a base layer 331, a foundation layer 332, a redistribution layer 333, a functional surface side raised part 334, and a joining promotion layer 335.

The base layer 331 contacts the functional surface 310, and is electrically connected directly to an appropriate place of the functional circuit on the functional surface 310. The functional surface 310 is made of Al, for example. The base layer 331 has a thickness of 0.1 μm to 10 μm, for example.

Here, the passivation film 340 and the protective film 350 will be described. The passivation film 340 is for preventing an excessive force from being loaded on the Si which is a main constituent of the semiconductor element 300, and is made of an insulating material such as SiN, for example. The passivation film 340 has a thickness of 200 nm to 3 μm, for example. The protective film 350 is laminated on the passivation film 340, and is for preventing an excessive force from being loaded on the Si which is a main constituent of the semiconductor element 300 and for facilitating formation of the redistribution layer 333. The protective film 350 is made of an insulating material such as polyimide, for example. The protective film 350 has a thickness of about 5 μm, for example.

A through hole 341 is formed in the passivation film 340. The through hole 341 is provided in order to expose the base layer 331 of the functional surface side electrode 330. In the present embodiment, the portion of the passivation film 340 surrounding the through hole 341 covers an end edge of the base layer 331. A through hole 351 is formed in the protective film 350. The through hole 351 coincides with the through hole 341 in plan view, and is provided in order to expose the base layer 331 of the functional surface side electrode 330.

Description will now return to the functional surface side electrodes 330. The foundation layer 332 provides a foundation for forming the redistribution layer 333. The foundation layer 332 coincides in shape with the functional surface side electrode 330 in plan view. That is, the foundation layer 332 covers the portion of the base layer 331 exposed from the passivation film 340 and the protective film 350, the through hole 341 in the passivation film 340, the through hole 351 in the protective film 350, and an appropriate region of the protective film 350. The foundation layer 332 is made of Ti, TiW, Ta or the like, for example. The foundation layer 332 has a thickness of about 100 nm.

The redistribution layer 333 is a main constituent of the functional surface side electrode 330, and is larger than the base layer 331 in plan view. The redistribution layer 333 is not particularly limited in material, and is made of Cu in the present embodiment. The redistribution layer 333 has a thickness of about 10 μm, for example.

The functional surface side raised part 334 is formed on the redistribution layer 333 and projects in the direction in which the functional surface 310 faces. The functional surface side raised part 334 is not particularly limited in material as long as the material is a conductive material, and is made of Cu in the present embodiment. Also, the functional surface side raised part 334 is not particularly limited in shape, and has a columnar shape in the present embodiment. The functional surface side raised part 334 has a diameter of 25 μm to 200 μm and a height of 10 μm to 500 μm. In plan view, the functional surface side raised part 334 is disposed in a position that avoids the base layer 331 so as to not overlap with the base layer 331. Also, the functional surface side raised part 334 overlaps with the passivation film 340 and the protective film 350 in plan view.

Also, in the present embodiment, as shown in FIG. 25, a plurality of functional surface side raised parts 334 are formed on the three functional surface side electrodes 330 that oppose the opposing parts 110 of the leads 101, 102 and 103. Eight functional surface side raised parts 334 are formed in four rows and two columns on the functional surface side raised part 334 that opposes the opposing part 110 of the lead 101. Four functional surface side raised parts 334 are formed in two rows and two columns on the functional surface side electrodes 330 that oppose the opposing parts 110 of the leads 102 and 103. One functional surface side raised part 334 each is formed on the functional surface side electrodes 330 that oppose the opposing parts 110 of the leads 104 to 107.

The joining promotion layer 335 constitutes the uppermost layer of the functional surface side electrode 330, and, in the present embodiment, covers the functional surface side raised parts 334 and the redistribution layer 333. The joining promotion layer 335 is for strengthening the junction between the functional surface side electrodes 330 and the opposing parts 110 of the leads 101 to 107. The joining promotion layer 335 contains at least one of Ni and Pd, and, in the present embodiment, consists of a Ni layer that directly covers the functional surface side raised parts 334 and the redistribution layer 333 and a Pd layer laminated on this Ni layer. The joining promotion layer 335 has a thickness of about 100 nm to 10 μm, for example. Also, apart from the materials given above, Cu, Al, Ti, Au or the like can be employed as appropriate as the material of the joining promotion layer 335.

The functional surface side electrodes 330 are joined to the opposing parts 110 of the leads 101 to 107 by solid state bonding. More specifically, the top faces of the functional surface side raised parts 334 are solid state bonded to the joining surfaces 113 of the opposing parts 110. Note that, in the present embodiment, a configuration is adopted in which the joining promotion layer 335 is interposed between the functional surface side raised parts 334 and the joining surfaces 113 of the opposing parts 110. Note that a joining promotion layer may be formed on the joining surfaces 113 of the opposing parts 110, in addition to or instead of forming the joining promotion layer 335 on the functional surface side electrodes 330.

The back surface metal layer 360 is formed on the back surface 320, and, in the present embodiment, entirely covers the surface of the back surface 320. The back surface metal layer 360 is made of a metal, and is made of Cu, Al, Ti, Au, or the like. The back surface metal layer 360 has a thickness of 0.1 μm to 10 μm, for example.

The joining promotion layer 361 is laminated on the back surface metal layer 360. The joining promotion layer 361 contains at least one of Ni and Pd, and, in the present embodiment, consists of a Ni layer that directly covers the back surface 320 and a Pd layer laminated on this Ni layer. The joining promotion layer 361 has a thickness of about 100 nm to 10 μm, for example. Also, apart from the materials given above, Cu, Al, Ti, Au or the like can be employed as appropriate as the material of the joining promotion layer 361.

The back surface metal layer 360 is joined to the joining surface 210 of the heat dissipation member 200 by solid state bonding. In the present embodiment, the joining promotion layer 361 is configured to be interposed between the back surface metal layer 360 and the joining surface 210. The back surface 220 of the heat dissipation member 200 has unevenness as described above due to the marks left by a jig being pressed thereagainst at the time of solid state bonding the back surface metal layer 360 to the heat dissipation member 200.

The sealing resin 400 entirely covers the semiconductor element 300 and covers the leads 101 to 107 except for the terminal parts 120. The sealing resin 400 is made of an insulating material, and, in the present embodiment, is made of a black epoxy resin, for example. In the present embodiment, the sealing resin 400 is also filled between the joining surfaces 113 of the opposing parts 110 and the joining promotion layers 335 of the functional surface side electrodes 330, in areas avoiding the functional surface side raised parts 334.

According to the present embodiment, the heat dissipation member 200 is solid state bonded to the back surface 320 of the semiconductor element 300. An increase in the joining efficiency of the heat dissipation member 200 with the back surface 320 of the semiconductor element 300 can thereby be achieved, compared with the case where joining is performed via a joining material, for example. Also, as a result of performing solid state bonding, the efficiency with which heat is transferred from the semiconductor element 300 to the heat dissipation member 200 can be enhanced, and the dissipation of heat from the semiconductor element 300 can be promoted.

The functional surface side raised parts 334 are joined to the opposing parts 110 of the leads 101 to 107 by solid state bonding. Solid state bonding involves both sides being directly joined to each other and does not require a joining medium interposed between both sides, such as wire or solder. Also, the solid state bonding of all of the functional surface side raised parts 334 and the opposing parts 110 of the leads 101 to 107 can be performed collectively. The manufacturing efficiency of the semiconductor device A3 can thereby be improved. Also, the joining strength of the functional surface side raised parts 334 with the opposing parts 110 of the leads 101 to 107 can be enhanced.

As a result of providing the functional surface side raised parts 334, it is possible to reduce the area of the junction between the functional surface side electrodes 330 and the opposing parts 110 of the leads 101 to 107. The force that needs to be applied in order to obtain a predetermined joining pressure at the time of solid state bonding can thereby be reduced. The semiconductor element 300 can thereby be prevented from being unintentionally damaged or the like. Also, as a result of providing the functional surface side raised parts 334, the sealing resin 400 can be reliably filled between the functional surface 310 of the semiconductor element 300 and the joining surfaces 113 of the opposing parts 110 of the leads 101 to 107. Places that need to be insulated in the semiconductor device A3 can thereby be more reliably insulated.

As a result of the functional surface side raised parts 334 not overlapping with the base layer 331 in plan view, it is possible to avoid the force at the time of solid state bonding being excessively loaded on the Si forming a main constituent of the semiconductor element 300. Also, as a result of the functional surface side raised parts 334 being overlapped with the passivation film 340 and the protective film 350 in plan view, the force at the time of solid state bonding can be absorbed by the passivation film 340 and the protective film 350.

As a result of providing the joining promotion layer 335, solid state bonding of the functional surface side raised parts 334 to the opposing parts 110 can be performed more reliably.

Figure 31:
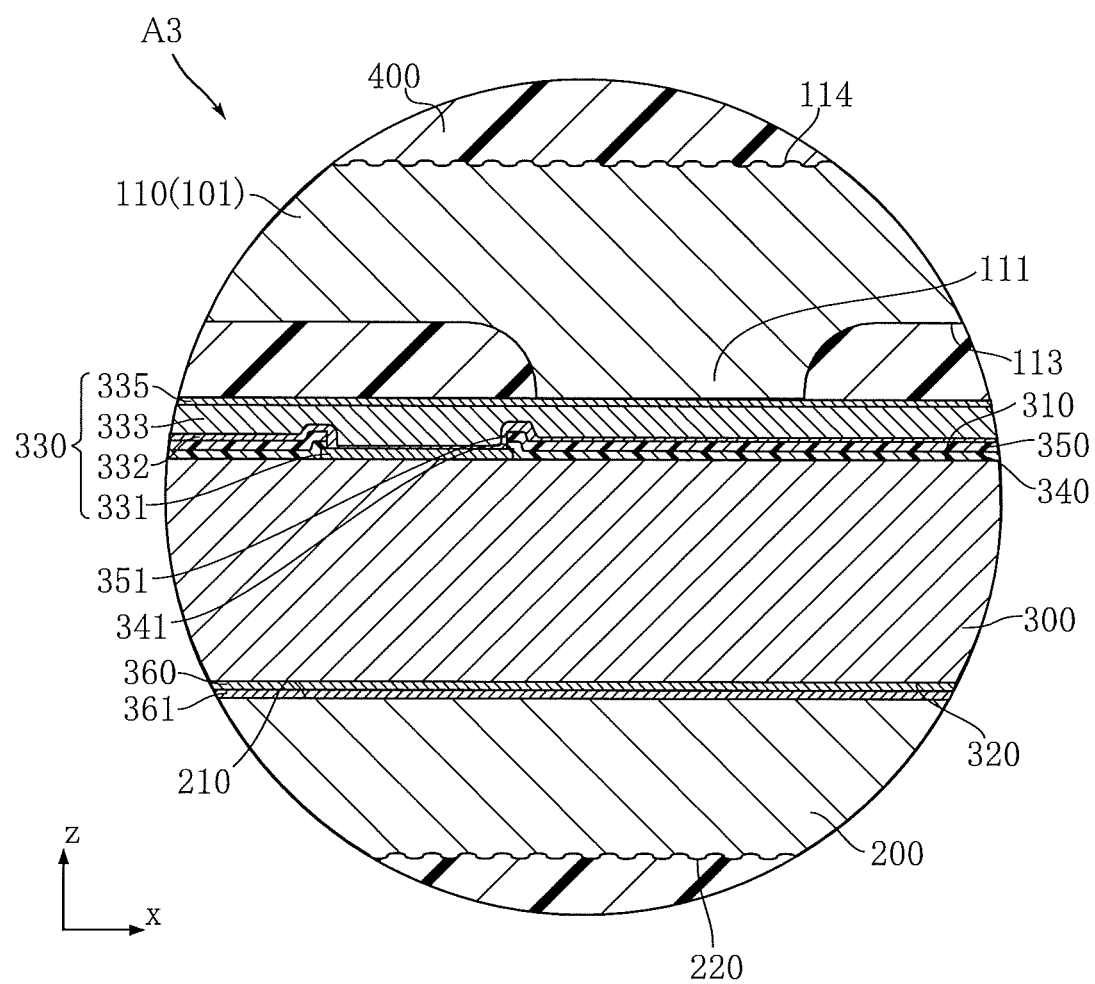
FIG. 31 is an enlarged cross-sectional view showing a main section of a modification of the semiconductor device of FIG. 25.

FIG. 31 shows the modification of the semiconductor device A3. In the present modification, the conduction supporting member side raised parts 111 described in relation to the semiconductor device A2 are formed on the opposing parts 110, instead of forming the functional surface side raised parts 334. An increase in the joining efficiency of the heat dissipation member 200 with the back surface 320 of the semiconductor element 300 can also be achieved according to such a modification. Also, dissipation of heat from the semiconductor element 300 can be promoted. Also, the semiconductor device A3 may be the configuration to have both the functional surface side raised parts 334 and the conduction supporting member side raised parts 111.

The semiconductor device according to the present invention is not limited to the abovementioned embodiments. Design changes can be freely made to the specific configurations of the various parts of the semiconductor device according to the present invention.

Configurations of the present invention and variations thereof are enumerated below as appendixes.

APPENDIX 1A

A semiconductor device comprising:

a semiconductor element having a functional surface on which a functional circuit is formed and a back surface facing in an opposite direction to the functional surface;

a conduction supporting member supporting the semiconductor element and electrically connected to the semiconductor element; and a resin package at least partially covering the semiconductor element and the conduction supporting member, wherein the semiconductor element has a functional surface side electrode formed on the functional surface, the conduction supporting member has a conduction supporting member side raised part that projects toward the functional surface side electrode, and the functional surface side electrode is joined to the conduction supporting member side raised part of the conduction supporting member by solid state bonding.

APPENDIX 2A

The semiconductor device according to appendix 1A, wherein the functional surface side electrode has a base layer that contacts the functional surface.

APPENDIX 3A

The semiconductor device according to appendix 2A, wherein the base layer is made of Al.

APPENDIX 4A

The semiconductor device according to appendix 2A, wherein the conduction supporting member side raised part and the base layer do not overlap with each other in plan view.

APPENDIX 5A

The semiconductor device according to appendix 2A, wherein the functional surface side electrode has a foundation layer laminated on the base layer.

APPENDIX 6A

The semiconductor device according to appendix 5A, wherein the foundation layer is made of one of Ti, W and Ta.

APPENDIX 7A

The semiconductor device according to appendix 5A, wherein the functional surface side electrode has a redistribution layer laminated on the foundation layer.

APPENDIX 8A

The semiconductor device according to appendix 7A, wherein the redistribution layer is made of Cu.

APPENDIX 9A

The semiconductor device according to appendix 7A, wherein the redistribution layer is larger than the base layer in plan view.

APPENDIX 10A

The semiconductor element according to any of appendix 7A, wherein the functional surface side electrode has a joining promotion layer that is positioned as an uppermost layer.

APPENDIX 11A

The semiconductor device according to appendix 10A, wherein the joining promotion layer of the functional surface side electrode is made of at least one of Ni and Pd.

APPENDIX 12A

The semiconductor device according to appendix 10A, wherein the joining promotion layer of the functional surface side electrode has a Ni layer that is positioned on the functional surface side and a Pd layer laminated on the Ni layer.

APPENDIX 13A

The semiconductor element according to appendix 7A, comprising a passivation film covering the functional surface and having formed therein a through hole that allows the functional surface side electrode to reach the functional surface.

APPENDIX 14A

The semiconductor device according to appendix 13A, wherein the passivation film is made of SiN.

APPENDIX 15A

The semiconductor device according to appendix 13A, wherein the redistribution layer overlaps with the passivation film in plan view.

APPENDIX 16A

The semiconductor device according to appendix 13A, wherein the conduction supporting member side raised part overlaps with the passivation film in plan view.

APPENDIX 17A

The semiconductor element according to appendix 13A, comprising a protective film laminated on the passivation film.

APPENDIX 18A

The semiconductor device according to appendix 17A, wherein the protective film is made of polyimide.

APPENDIX 19A

The semiconductor device according to appendix 17A, wherein the redistribution layer overlaps with the protective film in plan view.

APPENDIX 20A

The semiconductor device according to appendix 17A, wherein the conduction supporting member side raised part overlaps with the protective film in plan view.

APPENDIX 21A

The semiconductor device according to appendix 1A, wherein the conduction supporting member is a lead made of a metal.

APPENDIX 22A

The semiconductor element according to appendix 21A, wherein a portion of the lead projects from the resin package.

APPENDIX 23A

The semiconductor device according to appendix 21A, wherein a surface of the lead on an opposite side to a region where the lead is joined to the functional surface side electrode has unevenness.

APPENDIX 24A

The semiconductor device according to appendix 21A, wherein the conduction supporting member side raised part is constituted by a portion that is thicker than a surrounding portion.

APPENDIX 25A

The semiconductor device according to appendix 24A, wherein the conduction supporting member side raised part has a through hole formed therein.

APPENDIX 26A

The semiconductor device according to appendix 21A, wherein the conduction supporting member side raised part is formed from a bent portion of the conduction supporting member.

APPENDIX 27A

The semiconductor device according to appendix 1A, wherein the semiconductor element has a plurality of the functional surface side electrode.

APPENDIX 28A

The semiconductor device according to appendix 1A, wherein the functional surface side electrode is joined to the plurality of conduction supporting member side raised parts.

APPENDIX 29A

The semiconductor device according to appendix 1A, further comprising a heat dissipation member joined to the semiconductor element,
wherein the semiconductor element has a back surface metal layer formed on the back surface, and
the back surface metal layer of the semiconductor element is joined to the heat dissipation member by solid state bonding.

APPENDIX 30A

The semiconductor device according to appendix 29A, wherein a joining promotion layer is laminated on the back surface metal layer.

APPENDIX 31A

The semiconductor device according to appendix 30A, wherein the joining promotion layer on the back surface metal layer is made of at least one of Ni and Pd.

APPENDIX 32A

The semiconductor device according to appendix 29A, wherein a joining promotion layer is laminated on the heat dissipation member.

APPENDIX 33A

The semiconductor device according to appendix 32A, wherein the joining promotion layer on the heat dissipation member is made of at least one of Ni and Pd.

APPENDIX 34A

The semiconductor device according to appendix 29A, wherein a surface of the heat dissipation member on an opposite side to a region where the heat dissipation member is joined to the back surface metal layer has unevenness.

APPENDIX 35A

The semiconductor device according to appendix 29A, wherein a surface of the heat dissipation member on an opposite side to a region where the heat dissipation member is joined to the back surface metal layer is exposed from the resin package.

APPENDIX 1B

A semiconductor device comprising:
a semiconductor element having a functional surface on which a functional circuit is formed and a back surface facing in an opposite direction to the functional surface;
a conduction supporting member supporting the semiconductor element and electrically connected to the semiconductor element;
a heat dissipation member joined to the semiconductor element; and
a resin package at least partially covering the semiconductor element, the conduction supporting member and the heat dissipation member,
wherein the semiconductor element has a back surface metal layer formed on the back surface, and the back surface metal layer of the semiconductor element is joined to the heat dissipation member by solid state bonding.

APPENDIX 2B

The semiconductor device according to appendix 1B, wherein a joining promotion layer is laminated on the back surface metal layer.

APPENDIX 3B

The semiconductor device according to appendix 2B, wherein the joining promotion layer on the back surface metal layer is made of at least one of Ni and Pd.

APPENDIX 4B

The semiconductor device according to appendix 1B, wherein a joining promotion layer is laminated on the heat dissipation member.

APPENDIX 5B

The semiconductor device according to appendix 4B, wherein the joining promotion layer on the heat dissipation member is made of at least one of Ni and Pd.

APPENDIX 6B

The semiconductor device according to appendix 1B, wherein a surface of the heat dissipation member on an opposite side to a region where the heat dissipation member is joined to the back surface metal layer has unevenness.

APPENDIX 7B

The semiconductor device according to appendix 1B, wherein the semiconductor element has a functional surface side electrode formed on the functional surface.

APPENDIX 8B

The semiconductor device according to appendix 7B, wherein the functional surface side electrode is equipped with a functional surface side raised part that projects in a direction in which the functional surface faces, and
the functional surface side raised part of the functional surface side electrode is joined to the conduction supporting member by solid state bonding.

APPENDIX 9B

The semiconductor device according to appendix 7B, wherein the conduction supporting member has a conduction supporting member side raised part that projects toward the functional surface side electrode, and
the functional surface side electrode is joined to the conduction supporting member side raised part of the conduction supporting member by solid state bonding.

APPENDIX 10B

The semiconductor device according to appendix 7B, wherein the functional surface side electrode has a base layer that contacts the functional surface.

APPENDIX 11B

The semiconductor device according to appendix 10B, wherein the base layer is made of Al.

APPENDIX 12B

The semiconductor device according to appendix 10B, wherein the functional surface side electrode has a foundation layer laminated on the base layer.

APPENDIX 13B

The semiconductor device according to appendix 12B, wherein the foundation layer is made of one of Ti, W and Ta.

APPENDIX 14B

The semiconductor device according to appendix 12B, wherein the functional surface side electrode has a redistribution layer laminated on the foundation layer.

APPENDIX 15B

The semiconductor device according to appendix 14B, wherein the redistribution layer is made of Cu.

APPENDIX 16B

The semiconductor device according to appendix 14B, wherein the redistribution layer is larger than the base layer in plan view.

APPENDIX 17B

The semiconductor device according to appendix 14B, wherein the functional surface side electrode has a joining promotion layer that is positioned as an uppermost layer.

APPENDIX 18B

The semiconductor device according to appendix 17B, wherein the joining promotion layer of the functional surface side electrode is made of at least one of Ni and Pd.

APPENDIX 19B

The semiconductor device according to appendix 14B comprising a passivation film covering the functional surface and having formed therein a through hole that allows the functional surface side electrode to reach the functional surface.

APPENDIX 20B

The semiconductor device according to appendix 19B, wherein the passivation film is made of SiN.

APPENDIX 21B

The semiconductor device according to appendix 19B, wherein the redistribution layer overlaps with the passivation film in plan view.

APPENDIX 22B

The semiconductor device according to appendix 19B, comprising a protective film laminated on the passivation film.

APPENDIX 23B

The semiconductor device according to appendix 22B, wherein the protective film is made of polyimide.

APPENDIX 24B

The semiconductor device according to appendix 22B, wherein the redistribution layer overlaps with the protective film in plan view.

APPENDIX 25B

The semiconductor device according to appendix 1B, wherein the conduction supporting member is a lead made of a metal.

APPENDIX 26B

The semiconductor device according to appendix 25B, wherein a portion of the lead projects from the resin package.

APPENDIX 27B

The semiconductor device according to appendix 25B, wherein a surface of the lead on an opposite side to a region where the lead is joined to the functional surface side electrode has unevenness.

The invention claimed is:

1. A semiconductor device comprising:
    a semiconductor element having a functional surface on which a functional circuit is formed and a back surface facing in an opposite direction to the functional surface;
    a conduction supporting member supporting the semiconductor element and electrically connected to the semiconductor element; and
    a resin package at least partially covering the semiconductor element and the conduction supporting member,
    wherein the semiconductor element includes a functional surface side electrode that is formed on the functional surface and equipped with a functional surface side raised part projecting in a direction in which the functional surface faces,
    the functional surface side raised part of the functional surface side electrode is joined to the conduction supporting member by solid state bonding,
    the functional surface side electrode has a base layer that contacts the functional surface, and
    the functional surface side electrode has a foundation layer laminated on the base layer.
2. The semiconductor device according to claim 1, wherein the base layer is made of Al.
3. The semiconductor device according to claim 1, wherein the functional surface side raised part and the base layer do not overlap with each other in plan view.
4. The semiconductor device according to claim 1, wherein the foundation layer is made of one of Ti, W and Ta.
5. The semiconductor device according to claim 1, wherein the functional surface side electrode has a redistribution layer laminated on the foundation layer, and the functional surface side raised part is formed on the redistribution layer.
6. The semiconductor device according to claim 5, wherein the redistribution layer is made of Cu.
7. The semiconductor device according to claim 5, wherein the redistribution layer is larger than the base layer in plan view.
8. The semiconductor device according to claim 5, wherein the functional surface side electrode has a joining promotion layer that is positioned as an uppermost layer.
9. The semiconductor device according to claim 8, wherein the joining promotion layer of the functional surface side electrode contains at least one of Ni and Pd.
10. The semiconductor device according to claim 9, wherein the joining promotion layer of the functional surface side electrode has a Ni layer laminated on the functional surface side raised part and a Pd layer laminated on the Ni layer.
11. The semiconductor device according to claim 5, further comprising a passivation film covering the functional surface and having formed therein a through hole that allows the functional surface side electrode to reach the functional surface.
12. The semiconductor device according to claim 11, wherein the passivation film is made of SiN.
13. The semiconductor device according to claim 11, wherein the redistribution layer overlaps with the passivation film in plan view.
14. The semiconductor device according to claim 11, wherein the functional surface side raised part overlaps with the passivation film in plan view.
15. The semiconductor device according to claim 11, further comprising a protective film laminated on the passivation film.
16. The semiconductor device according to claim 15, wherein the protective film is made of polyimide.
17. The semiconductor device according to claim 15, wherein the redistribution layer overlaps with the protective film in plan view.
18. The semiconductor device according to claim 15, wherein the functional surface side raised part overlaps with the protective film in plan view.
19. The semiconductor device according to claim 1, wherein the functional surface side raised part is made of Cu.
20. The semiconductor device according to claim 1, wherein the semiconductor element has a plurality of the functional surface side electrode.
21. A semiconductor device, comprising:
    a semiconductor element having a functional surface on which a functional circuit is formed and a back surface facing in an opposite direction to the functional surface;
    a conduction supporting member supporting the semiconductor element and electrically connected to the semiconductor element; and
    a resin package at least partially covering the semiconductor element and the conduction supporting member,
    wherein the semiconductor element includes a functional surface side electrode that is formed on the functional surface and equipped with a functional surface side raised part projecting in a direction in which the functional surface faces,
    the functional surface side raised part of the functional surface side electrode is joined to the conduction supporting member by solid state bonding, and
    the conduction supporting member is a lead made of a metal, and a portion the lead projects from the resin package.

22. A semiconductor device, comprising:
- a semiconductor element having a functional surface on which a functional circuit is formed and a back surface facing in an opposite direction to the functional surface;
- a conduction supporting member supporting the semiconductor element and electrically connected to the semiconductor element; and
- a resin package at least partially covering the semiconductor element and the conduction supporting member,
- wherein the semiconductor element includes a functional surface side electrode that is formed on the functional surface and equipped with a functional surface side raised part projecting in a direction in which the functional surface faces,
- the functional surface side raised part of the functional surface side electrode is joined to the conduction supporting member by solid state bonding, and
- the functional surface side electrode has a plurality of the functional surface side raised part.

23. A semiconductor device, comprising:
- a semiconductor element having a functional surface on which a functional circuit is formed and a back surface facing in an opposite direction to the functional surface;
- a conduction supporting member supporting the semiconductor element and electrically connected to the semiconductor element; and
- a resin package at least partially covering the semiconductor element and the conduction supporting member,
- wherein the semiconductor element includes a functional surface side electrode that is formed on the functional surface and equipped with a functional surface side raised part projecting in a direction in which the functional surface faces,
- the functional surface side raised part of the functional surface side electrode is joined to the conduction supporting member by solid state bonding,
- the semiconductor device comprises a heat dissipation member joined to the semiconductor element,
- the semiconductor element has a back surface metal layer formed on the back surface, and
- the back surface metal layer of the semiconductor element is joined to the heat dissipation member by solid state bonding.

24. The semiconductor device according to claim 23, wherein a joining promotion layer is laminated on the back surface metal layer.

25. The semiconductor device according to claim 24, wherein the joining promotion layer on the back surface metal layer contains at least one of Ni and Pd.

26. The semiconductor device according to claim 23, wherein a joining promotion layer is laminated on the heat dissipation member.

27. The semiconductor device according to claim 26, wherein the joining promotion layer on the heat dissipation member contains at least one of Ni and Pd.

28. The semiconductor device according to claim 23, wherein a surface of the heat dissipation member on an opposite side to a region where the heat dissipation member is joined to the back surface metal layer has unevenness.

29. The semiconductor device according to claim 23, wherein a surface of the heat dissipation member on an opposite side to a region where the heat dissipation member is joined to the back surface metal layer is exposed from the resin package.

30. A semiconductor device, comprising:
- a semiconductor element having a functional surface on which a functional circuit is formed and a back surface facing in an opposite direction to the functional surface;
- a conduction supporting member supporting the semiconductor element and electrically connected to the semiconductor element; and
- a resin package at least partially covering the semiconductor element and the conduction supporting member,
- wherein the semiconductor element includes a functional surface side electrode that is formed on the functional surface and equipped with a functional surface side raised part projecting in a direction in which the functional surface faces,
- the functional surface side raised part of the functional surface side electrode is joined to the conduction supporting member by solid state bonding,
- the conduction supporting member is a lead made of a metal, and
- a surface of the lead on an opposite side to a region where the lead is joined to the functional surface side electrode has unevenness.

* * * * *